(12) United States Patent
Heo et al.

(10) Patent No.: US 11,281,880 B2
(45) Date of Patent: Mar. 22, 2022

(54) DISPLAY AND ELECTRONIC DEVICE INCLUDING THE SAME

(71) Applicant: Samsung Electronics Co., Ltd., Suwon-si (KR)

(72) Inventors: Changryong Heo, Suwon-si (KR); Dongil Son, Suwon-si (KR); Chihyun Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 253 days.

(21) Appl. No.: 16/742,473

(22) Filed: Jan. 14, 2020

(65) Prior Publication Data

US 2020/0257873 A1 Aug. 13, 2020

(30) Foreign Application Priority Data

Feb. 13, 2019 (KR) ........................ 10-2019-0016673

(51) Int. Cl.
*G06K 9/00* (2006.01)
*H01L 27/12* (2006.01)

(52) U.S. Cl.
CPC ....... *G06K 9/0002* (2013.01); *G06K 9/00087* (2013.01); *H01L 27/1214* (2013.01)

(58) Field of Classification Search
None
See application file for complete search history.

(56) References Cited

U.S. PATENT DOCUMENTS

| 9,323,393 | B2 | 4/2016 | Djordjev et al. |
| 9,465,429 | B2 | 10/2016 | Kitchens, II et al. |
| 9,494,995 | B2 | 11/2016 | Kitchens, II et al. |
| 9,606,606 | B2 | 3/2017 | Kitchens, II et al. |
| 9,798,372 | B2 | 10/2017 | Kitchens, II et al. |
| 9,815,087 | B2 | 11/2017 | Ganti et al. |
| 9,836,165 | B2 | 12/2017 | Nho et al. |

(Continued)

FOREIGN PATENT DOCUMENTS

| JP | 2007-264958 A | 10/2007 |
| KR | 10-2016-0096648 A | 8/2016 |

(Continued)

OTHER PUBLICATIONS

International Search Report dated May 8, 2020, issued in International Application No. PCT/KR2020/000648.

*Primary Examiner* — Nicholas J Lee
(74) *Attorney, Agent, or Firm* — Jefferson IP Law, LLP

(57) ABSTRACT

A display device and an electronic device including the same are provided. The display device includes a cover glass, a substrate disposed under the cover glass, a display light emitting layer disposed between the cover glass and the substrate and including a plurality of pixels, a fingerprint sensor layer disposed between the display light emitting layer and the substrate to generate sound waves in a specified frequency band in connection with obtaining of fingerprint information of a user's body in contact with a portion of the cover glass, and a thin film transistor (TFT) circuit layer disposed between the fingerprint sensor layer and the substrate and including a plurality of first transistors related to driving of the plurality of pixels and a plurality of second transistors related to driving of the fingerprint sensor layer.

20 Claims, 16 Drawing Sheets

(56) References Cited

U.S. PATENT DOCUMENTS

| | | |
|---|---|---|
| 9,953,205 B1 | 4/2018 | Rasmussen et al. |
| 10,031,602 B2 | 7/2018 | Kitchens, II et al. |
| 10,073,305 B2 | 9/2018 | Lin et al. |
| 10,102,417 B2 | 10/2018 | Shim et al. |
| 10,478,858 B2 | 11/2019 | Lasiter et al. |
| 10,607,057 B2 | 3/2020 | Kwon et al. |
| 2014/0354596 A1 | 12/2014 | Djordjev et al. |
| 2014/0354597 A1 | 12/2014 | Kitchens, II et al. |
| 2015/0165479 A1 | 6/2015 | Lasiter et al. |
| 2015/0169136 A1* | 6/2015 | Ganti .................. H01L 41/0973 345/177 |
| 2015/0331508 A1 | 11/2015 | Nho et al. |
| 2017/0364726 A1 | 12/2017 | Buchan et al. |
| 2017/0372122 A1 | 12/2017 | Shim et al. |
| 2018/0101714 A1 | 4/2018 | Lin et al. |
| 2018/0204040 A1 | 7/2018 | Kwon et al. |
| 2018/0316037 A1 | 11/2018 | Song et al. |
| 2018/0357457 A1 | 12/2018 | Rasmussen et al. |
| 2019/0065806 A1* | 2/2019 | Cheng .................. G06K 9/0002 |
| 2019/0080131 A1* | 3/2019 | Lee ...................... G06K 9/0002 |
| 2019/0095046 A1* | 3/2019 | Guo ...................... B06B 1/0622 |

FOREIGN PATENT DOCUMENTS

| | | |
|---|---|---|
| KR | 10-2018-0001358 A | 1/2018 |
| KR | 10-2018-0059720 A | 6/2018 |

\* cited by examiner

DISPLAY AND ELECTRONIC DEVICE INCLUDING THE SAME

CROSS-REFERENCE TO RELATED APPLICATION(S)

This application is based on and claims priority under 35 U.S.C. § 119(a) of a Korean patent application number 10-2019-0016673, filed on Feb. 13, 2019, in the Korean Intellectual Property Office, the disclosure of which is incorporated by reference herein in its entirety.

BACKGROUND

1. Field

The disclosure relates to a display-based user biometric information sensing technology. More particularly, the disclosure relates to a display capable of enhancing reliability of user fingerprint authentication by arranging a thermistor layer related to correction of acquired fingerprint information as a layer of the display, and an electronic device including the same.

2. Description of Related Art

With the evolution of an electronic device into a medium supporting various functions or services, an operating environment of the electronic device may involve sensitive and private information resources, such as user personal information or financial information. Accordingly, a high level of security policy is required for electronic devices, and biometric authentication systems based on a user's unique physical characteristics have been installed in recent electronic devices. Among various types of biometric authentication systems, fingerprint recognition technology utilizing a user's fingerprint information has been adopted as general biometric authentication means due to relatively high security and ease of operation.

The above information is presented as background information only to assist with an understanding of the disclosure. No determination has been made, and no assertion is made, as to whether any of the above might be applicable as prior art with regard to the disclosure.

SUMMARY

As an example of the operation of the fingerprint recognition technology, a so-called in-display method, which implements an active area of a display as a sensing area for obtaining (or acquiring) fingerprint information, has been proposed. In this regard, a fingerprint sensor for sensing the fingerprint information may be disposed in an area of a back surface of the display by embedding the fingerprint sensor in a cut space formed by cutting some layers of the display (e.g., a cushion layer and/or a thermal layer) with a predetermined depth. However, to maintain the functionality of some layers, the cut space may be formed in a limited size. In this case, the sensing area of the fingerprint sensor on the active area of the display may be limited to a partial area corresponding to the space in which the fingerprint sensor is disposed. In addition, there may be another layer of the display, which is not cut, above the fingerprint sensor embedded in the cut space, and in this case, it is not easy to arrange the fingerprint sensor to be adjacent to the sensing area with which a user's body (for example, a finger) is in contact, leading to insignificant sensing efficiency.

Aspects of the disclosure are to address at least the above-mentioned problems and/or disadvantages and to provide at least the advantages described below. Accordingly, an aspect of the disclosure is to provide a display capable of supporting fingerprint recognition on the entire area of an active area by arranging a fingerprint sensor having an area corresponding to an active area between some layers constituting the display and improving sensing efficiency by shorting a distance between the sensing area and the fingerprint sensor, and an electronic device including the same.

Another aspect of the disclosure is to provide a display capable of enhancing reliability of user fingerprint authentication by arranging a thermistor layer related to correction of acquired fingerprint information as a layer of the display, and an electronic device including the same.

Additional aspects will be set forth in part in the description which follows and, in part, will be apparent from the description, or may be learned by practice of the presented embodiments.

In accordance with an aspect of the disclosure, a display device is provided. The display device includes a cover glass, a substrate disposed under the cover glass, a display light emitting layer disposed between the cover glass and the substrate and including a plurality of pixels, a fingerprint sensor layer disposed between the display light emitting layer and the substrate to generate sound waves in a specified frequency band in connection with obtaining (or acquiring) of fingerprint information of a user's body in contact with a portion of the cover glass, and a thin film transistor (TFT) circuit layer disposed between the fingerprint sensor layer and the substrate and including a plurality of first transistors related to driving of the plurality of pixels and a plurality of second transistors related to driving of the fingerprint sensor layer.

In accordance with another aspect of the disclosure, an electronic device is provided. The electronic device includes a cover glass, a display disposed under the cover glass to acquire fingerprint information of a user's body contacting the portion of the cover glass, a memory configured to store the fingerprint information of the user's body in advance, and at least one processor configured to perform authentication of the fingerprint information acquired through the display based on the fingerprint information of the user's body stored in the memory in advance.

In accordance with another aspect of the disclosure, a display is provided. The display includes a substrate, a display light emitting layer disposed between the cover glass and the substrate and including a plurality of pixels, a fingerprint sensor layer disposed between the display light emitting layer and the substrate and including a plurality of piezoelectric elements that generate sound waves in a specified frequency band in connection with acquirement of the fingerprint information, and a thin film transistor (TFT) circuit layer disposed between the fingerprint sensor layer and the substrate and including a plurality of first transistors related to driving of the plurality of pixels and a plurality of second transistors related to driving of the fingerprint sensor layer.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
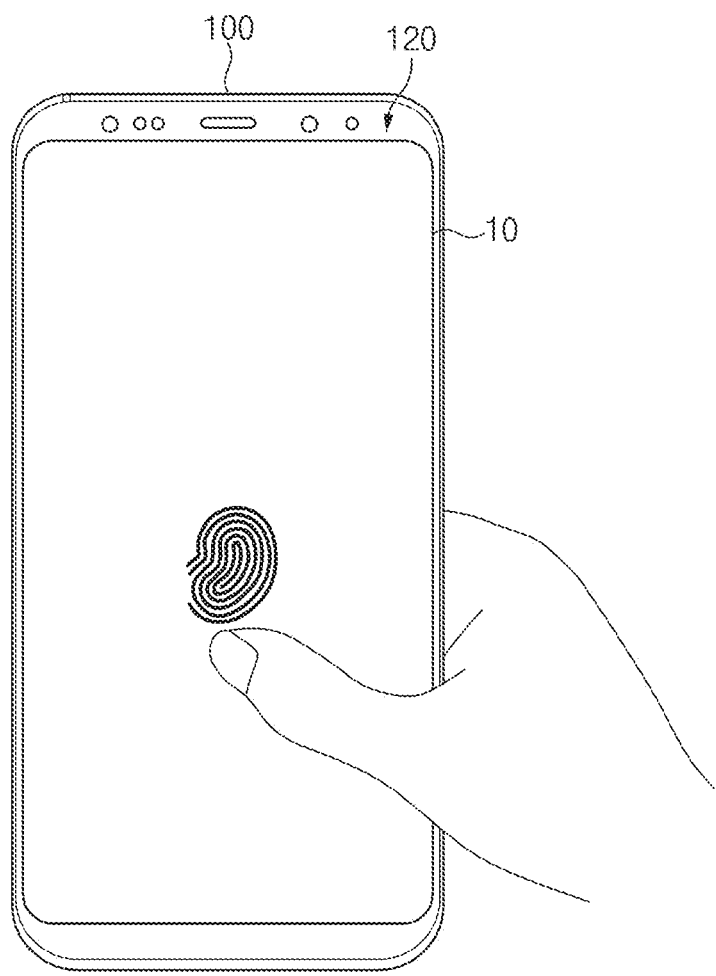
FIG. 1 is a diagram illustrating a process of operating an electronic device according to an embodiment of the disclosure.

FIG. 1 is a diagram illustrating a process of operating an electronic device according to an embodiment of the disclosure.

Referring to FIG. 1, an electronic device 100 may perform biometric authentication for a user according to a specified operating environment. For example, when an event related to screen unlock processing, electronic payment-based payment processing, mobile banking-based financial transaction processing or the like occurs on the electronic device 100, the electronic device 100 may drive a scheduled biometric authentication system to initiate a fingerprint authentication process for a user.

In an embodiment of the disclosure, a fingerprint sensor (e.g., a fingerprint sensor layer to be described later) that supports the fingerprint authentication process may be disposed below an active area 10 (or a view area) of a display 120 on the electronic device 100. For example, the fingerprint sensor may be formed to have an area corresponding to the active area 10 and disposed between specific layers constituting the display 120. According to an embodiment of the disclosure, an area between the specific layers, in which the fingerprint sensor is disposed may be an area having no relation with a layer related to light emission of the display 120 (e.g., a display light emitting layer to be described later). In various embodiments of the disclosure, the fingerprint sensor may be formed to have a larger area than the active area 10 to cover fingerprint recognition on a bezel area surrounding the active area 10, as well as on the active area 10 and disposed between the specific layers. In this case, the area of the fingerprint sensor may substantially correspond to a front of the electronic device 100.

In an embodiment of the disclosure, the fingerprint sensor may generate sound waves (e.g., ultrasonic waves) in a specific frequency band based on physical displacement (e.g., vibration) to collect fingerprint information of a user's body (e.g., a finger) that is in contact with the active area 10 of the display 120 (or a front area of the electronic device 100). For example, the fingerprint sensor may generate sound waves of which at least some are directed toward the active area 10 and collect response signals of sound waves reflected from the user's body to acquire information related to fingerprint authentication. In this regard, when an event related to the fingerprint authentication occurs, the electronic device 100 may display content (e.g., a fingerprint image) providing a guide for a contact area of the user's body on the display 120. According to various embodiments of the disclosure, the content may be displayed on an area to which the user's body holding the electronic device 100 is easily accessible (e.g., an area included in a moving line range of the user's body) in the active area 10 of the display 120. Alternatively, the electronic device 100 may wait for a contact of the user's body on the active area 10 of the display 120 (or the front area of the electronic device 100) in a state in which the content is not displayed separately, and when the contact of the user's body is detected, the electronic device 100 may allow the content to be displayed.

As described above, the display 120 of the electronic device 100 according to an embodiment may include a fingerprint sensor corresponding to the active area 10 or having a relatively larger area than the active area 10 as a portion of a layer to support fingerprint recognition on the entire area of the active area 10 (or the front area of the electronic device 100). In addition, the display 120 may include the fingerprint sensor as a separate layer from a layer related to light emission (for example, a display light emitting layer to be described later) to support fingerprint recognition with no effect on resolution. Hereinafter, various structures of the display 120 including the fingerprint sensor and various functional operations of the electronic device 100 related to the operation of the fingerprint sensor will be described.

Figure 2:
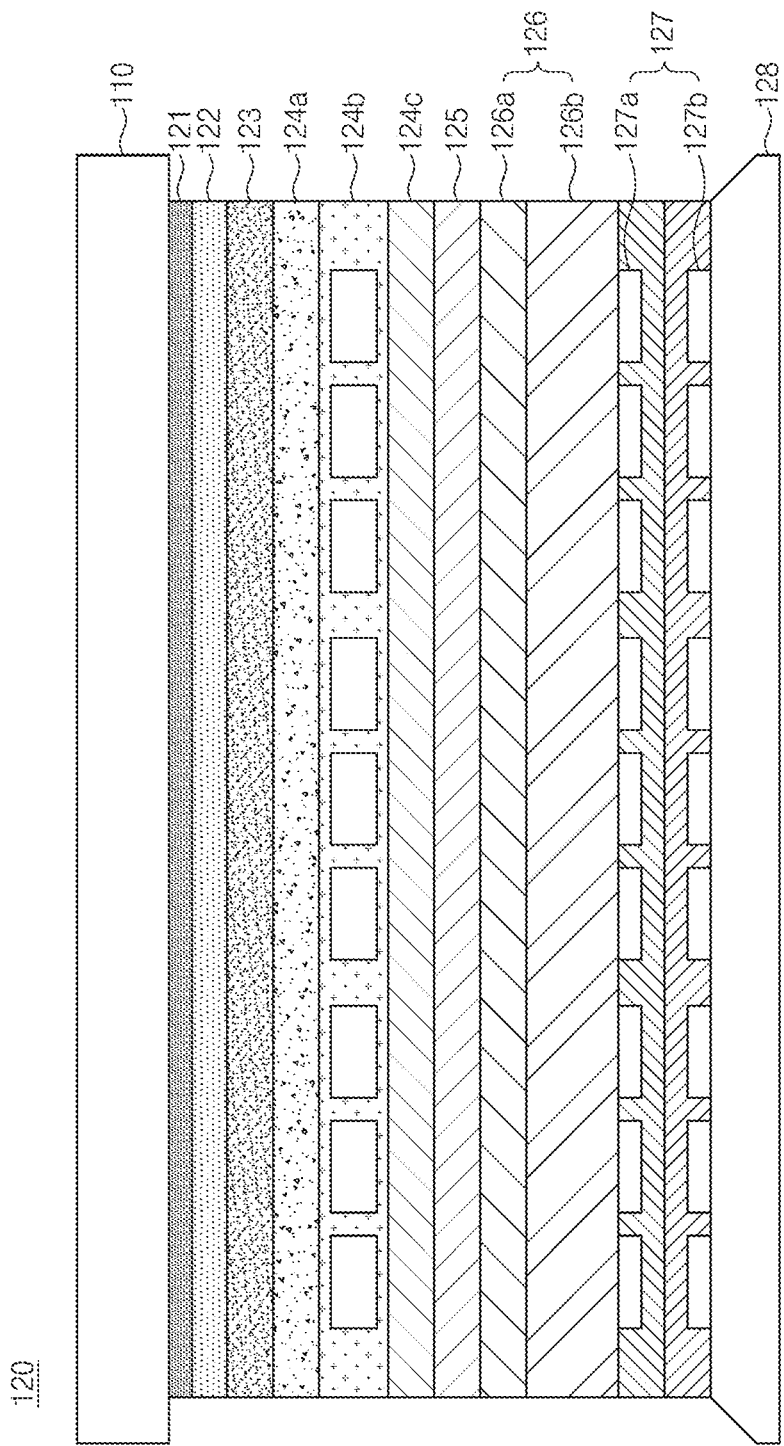
FIG. 2 is a diagram illustrating a display according to an embodiment of the disclosure.
Figure 3:
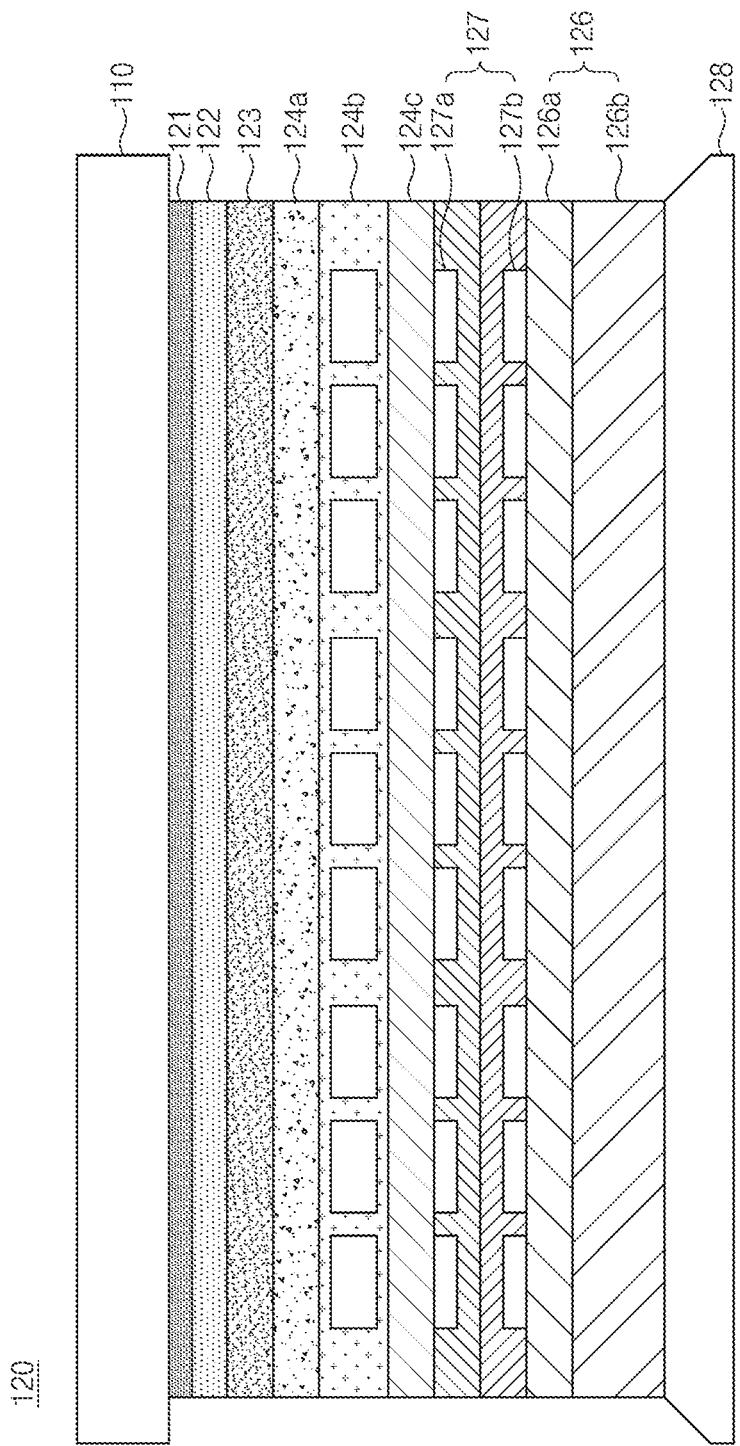
FIG. 3 is a diagram illustrating a display according to an embodiment of the disclosure.

FIG. 2 is a diagram illustrating a display according to an embodiment of the disclosure, and FIG. 3 is a diagram illustrating a display according to an embodiment of the disclosure.

Referring to FIG. 3, the same reference numerals may be given to the same or corresponding components as those mentioned through FIG. 2, and redundant description may be omitted.

Referring to FIG. 2, the display 120 according to an embodiment may include at least one of a polarizing plate 122, a touch panel 123, a first electrode 124a, a display light emitting layer 124b, and a second electrode 124c, a fingerprint sensor layer 126, a thin film transistor (TFT) circuit layer 127, and a substrate 128, which are stacked or arranged in a specified sequence. According to various embodiments of the disclosure, the display 120 may omit at least one of the above-described components or may further include other components. For example, the display 120 may further include, as a component, a cover glass 110 (or a glass window, a window glass, a window, an external protection layer) arranged in the uppermost layer with respect to the above-described components.

According to an embodiment of the disclosure, the display 120 may receive an image driving signal corresponding to screen information at a specified frame rate, process the image driving signal, and output various screens. For example, when a user fingerprint authentication event occurs, the display 120 may output content (e.g., fingerprint image) providing a guide for a contact area of the user's body (e.g., a finger) related to the fingerprint authentication. In this regard, the display 120 may have at least a portion (e.g., the active area 10 of FIG. 1) exposed to the outside, and some layers thereof (e.g., the cover glass 110, an adhesive member 121, the polarizing plate 122 and the touch panel 123) may include a material that is optically transparent.

The cover glass 110 may protect components of the display 120 stacked or arranged below the cover glass 110 from the outside. Alternatively, the cover glass 110 may transmit light generated by the display light emitting layer 124b to support the user's screen visibility. In this regard, the cover glass 110 may be formed of, for example, tempered glass or a flexible transparent polymer (e.g., polyimide) film According to an embodiment of the disclosure, the cover glass 110 may function as an interface through which a user input (e.g., a touch) is performed. For example, at least a portion of a user's body (e.g., a finger) related to fingerprint authentication may be in contact with a portion of an upper surface of the cover glass 110 for a predetermined time.

The polarizing plate 122 may be disposed under (or below) the cover glass 110 based on the specified adhesive member 121 (e.g., an optically clear adhesive (OCA) or an optically clear resin (OCR)), and delay a phase of light incident on the cover glass 110 or selectively transmit only light oscillating along a specified phase axis. In various embodiments of the disclosure, one or both surfaces of the polarizing plate 122 may include a protective film (e.g., a low-reflective (LR) film, an anti-glare (AG) film, or an anti-reflective (AR) film) for reducing light reflectance of the polarizing plate 122 or suppressing light scattering and surface reflection.

The touch panel 123 may detect a signal for a user input performed on the cover glass 110 and transfer the detected signal to a touch module (or touch IC). For example, the touch panel 123 may detect the position, the number of times of user inputs, the occurrence time, or the duration of the user input through the internal structure according to the electrostatic method, the pressure sensitive method, or the resistance method. Although the touch panel 123 is illustrated as being disposed on the light emitting structure layer including the first electrode 124a, the display light emitting layer 124b, and the second electrode 124c in FIG. 2 and the drawings to be described below, according to various embodiments of the disclosure, the touch panel 123 may be included in various layers of the display 120 based on an add on or in cell approach.

In an embodiment of the disclosure, the first electrode 124a (e.g., indium tin oxide), the second electrode 124c (e.g., cesium (Cs), lithium (Li), aluminum (Al), copper (Cu) or silver (Ag)) and the display light emitting layer 124b disposed between the first electrode 124a and the second electrode 124c may be attributable to the screen output of the display 120. For example, each of the first electrode 124a and the second electrode 124c may inject holes and electrons into the display light emitting layer 124b, and a plurality of pixels (or, sub-pixels included in the plurality of pixels) which the display light emitting layer 124b includes may emit light by energy emitted by recombination of the holes and electrons.

The fingerprint sensor layer 126 may be disposed under (or below) the light emitting structure layer including the first electrode 124a, the display light emitting layer 124b, and the second electrode 124c, to acquire fingerprint information for the user's body in contact with the cover glass 110. For example, the fingerprint sensor layer 126 may emit sound waves (e.g., ultrasonic waves) of a specific frequency band toward the cover glass 110, collect response signals of sound waves reflected on the user's body, and acquire fingerprint information of the user. In this regard, the fingerprint sensor layer 126 may include a third electrode 126a and a piezo layer 126b, and an insulating layer 125 to prevent electrical conduction between the third electrode 126a and the second electrode 124c may be arranged between the third electrode 126a and the second electrode 124c.

According to an embodiment of the disclosure, the third electrode 126a may function as a reference electrode for applying a voltage to the piezo layer 126b, and the piezo layer 126b may include a plurality of piezoelectric elements corresponding to a plurality of sub-pixels respectively, which are included in the display light emitting layer 124b. In this regard, when a voltage is applied to the piezo layer 126b, at least some of the plurality of piezoelectric elements may generate sound waves in the specific frequency band based on physical displacement (e.g., vibration) characteristics. In addition, when external sound waves are received by the piezo layer 126b, at least some of the plurality of piezoelectric elements may generate different voltages due to pressure caused by the received sound waves, and the generated voltages may be referred to for obtaining (or acquiring) user fingerprint information.

In an embodiment of the disclosure, the fingerprint sensor layer 126 including the third electrode 126a and the piezo layer 126b may be disposed to have an area corresponding or similar to that of a light emitting structure layer including the first electrode 124a, the display light emitting layer 124b, and the second electrode 124c. Accordingly, the fingerprint sensor layer 126 may support fingerprint recognition on the entire area of the active area 10 (FIG. 1) (or the area of the cover glass 110 corresponding to the active area 10) of the display 120.

In various embodiments of the disclosure, layers stacked or arranged on the fingerprint sensor layer 126 (e.g., the insulating layer 125, the first electrode 124a, the display light emitting layer 124b, the second electrode 124c, the touch panel 123, the polarizing plate 122, and the cover glass 110) may not substantially include an air gap or a void. In this regard, the air gap or void may interfere with the traveling of sound waves due to a difference in impedance with the layers of the display 120. Accordingly, to minimize a change (e.g., refraction or reflection) in a path of sound waves directed to the cover glass 110 with which the user's body is in contact or sound waves reflected by the user's body and incident into the display 120, the layers on the fingerprint sensor layer 126 may be formed so as not to include an air gap or void.

The TFT circuit layer 127 is disposed under the fingerprint sensor layer 126 to support individual controls for a plurality of elements (e.g., a plurality of subpixels or a plurality of piezoelectric elements) constituting the display light emitting layer 124b and the fingerprint sensor layer 126 disposed thereon. In this regard, the TFT circuit layer 127 may include a plurality of pixel circuit areas acquired by physical or logical division. The plurality of pixel circuit areas may be, for example, areas corresponding one-to-one with a plurality of subpixels of the display light emitting layer 124b and a plurality of piezoelectric elements of the fingerprint sensor layer 126. In other words, each of the plurality of pixel circuit areas may include a plurality of display TFTs 127a for driving subpixels of the corresponding display light emitting layer 124b and a plurality of piezo TFTs 127b for driving piezoelectric elements of the corresponding fingerprint sensor layer 126.

The substrate 128 may be disposed as the lowermost layer of the display 120, and may physically support and fix the layers stacked or disposed thereon (e.g., the TFT circuit layer 127, the fingerprint sensor layer 126, the insulating layer 125, and the first electrode 124a, the display light emitting layer 124b, the second electrode 124c, the touch panel 123, and the polarizing plate 122. In various embodiments of the disclosure, the substrate 128 may include a rigid material (e.g., glass, ceramic, or metal) or may include a flexible material (e.g., polymer or plastic). Alternatively, the substrate 128 may be formed by a mixture of the rigid material and the flexible material.

Referring to FIG. 3, the display 120 according to various embodiments may include a structure partially different from that described above with reference to FIG. 2 in relation to the stacking or arranging of layers. For example, the TFT circuit layer 127 included in the display 120 may be arranged in an area between the light emitting structure layer, which includes the first electrode 124a, the display light emitting layer 124b, and the second electrode 124c, and the fingerprint sensor layer 126 disposed under the light emitting structure layer, in addition to an area between the fingerprint sensor layer 126 (FIG. 2) and the substrate 128 (FIG. 2). Due to this, each of the display light emitting layer 124b and the fingerprint sensor layer 126 which are related to the functional operation of the TFT circuit layer 127 may be disposed above and below the TFT circuit layer 127, thereby achieving easy circuit design between the display light emitting layer 124b and the plurality of display TFTs 127a of the TFT circuit layer 127 or between the fingerprint sensor layer 126 and the plurality of piezo TFTs 127b of the TFT circuit layer 127.

Figure 4:
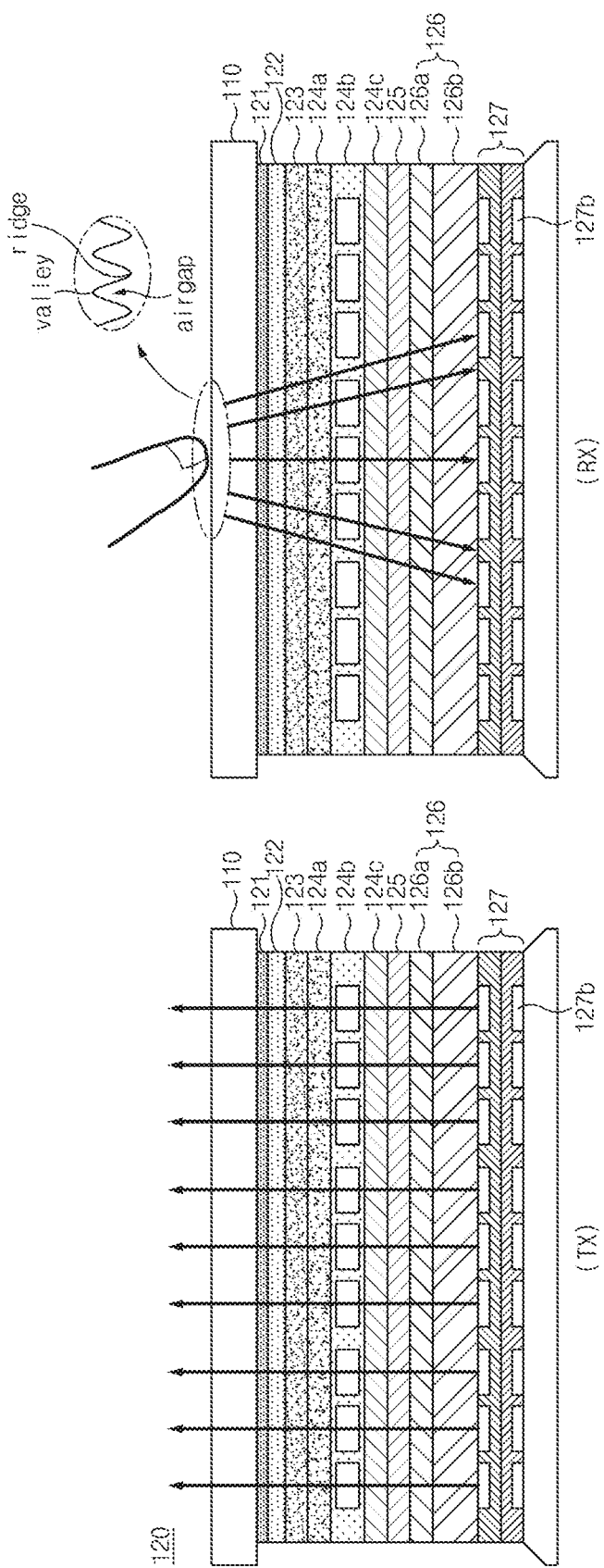
FIG. 4 is a diagram illustrating a fingerprint information sensing type using a display according to an embodiment of the disclosure.
Figure 5:
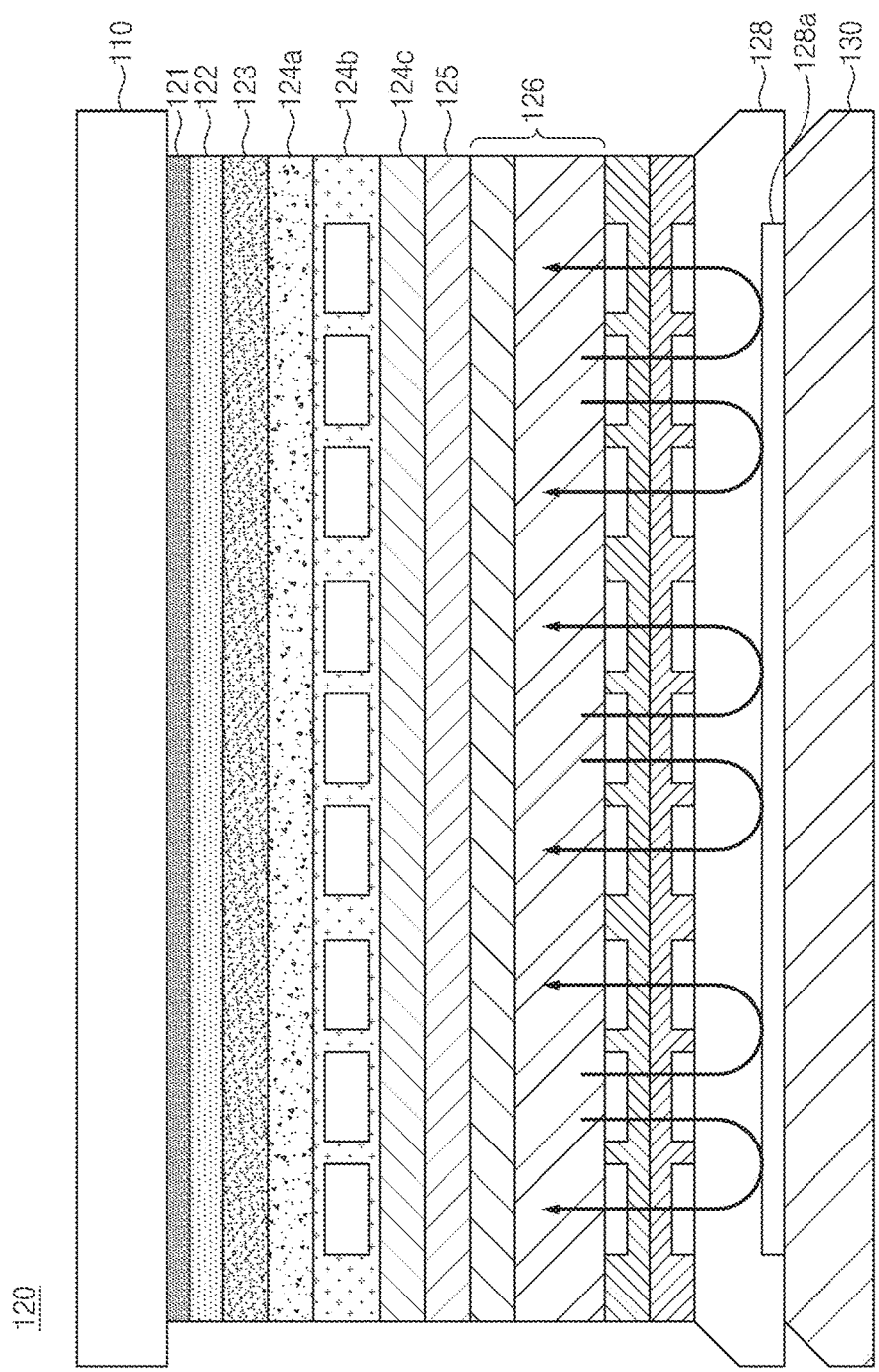
FIG. 5 is a diagram illustrating a display according to an embodiment of the disclosure.

FIG. 4 is a diagram illustrating a fingerprint information sensing type using a display according to an embodiment of the disclosure, and FIG. 5 is a diagram illustrating a display according to an embodiment of the disclosure.

Referring to FIG. 4, the fingerprint sensor layer 126 included in the display 120 may operate in a time-division manner in connection with obtaining (or acquiring, collecting) of fingerprint information of a user. For example, the fingerprint sensor layer 126 may perform an operation (e.g., TX operation) of irradiating sound waves (e.g., ultrasonic waves) in a specified frequency band during a first period, and perform an operation (e.g., an RX operation) of receiving at least some sound waves reflected by the user's body (e.g., a finger) among the irradiated sound waves during a second period after the first period.

Referring to the sound wave irradiation operation (e.g., TX operation) of the fingerprint sensor layer 126 according to the first period, when an event related to user fingerprint authentication occurs, an analog signal in a specified frequency band (e.g., about 15 to 20 megahertz (MHz) frequency/200 Peak-to-Peak (Vpp) voltage) is input to the third electrode 126a of the fingerprint sensor layer 126 and the plurality of piezo TFTs 127b included in the TFT circuit layer 127 may be grounded. Accordingly, a voltage of a predetermined magnitude may be applied to the piezo layer 126b positioned between the third electrode 126a and the plurality of piezo TFTs 127b, and the plurality of piezoelectric elements included in the piezo layer 126b may generate sound waves in a specific frequency band by causing physical displacement (e.g., vibration) based on the applied voltage. According to an embodiment of the disclosure, at least some of the sound waves may be directed toward the above of the fingerprint sensor layer 126, and travel through various media (e.g., the insulating layer 125, the first electrode 124a, the display light emitting layer 124b, the second electrode 124c, the touch panel 123, the polarizing plate 122, an adhesive member 121, and the cover glass 110 or the like) stacked or disposed on the fingerprint sensor layer 126.

Referring to the sound wave reception operation (e.g., RX operation) of the fingerprint sensor layer 126 according to the second period, the third electrode 126a of the fingerprint sensor layer 126 may be grounded and each of the plurality of piezo TFTs 127b of the TFT circuit layer 127 may be switched to and electrically connected to a corresponding piezoelectric element (e.g., corresponding to a corresponding pixel circuit area), thereby waiting for reception of at least some sound waves reflected by the user's body among sound waves irradiated in the first period.

According to an embodiment of the disclosure, at least some of the sound waves irradiated in the first period may be reflected to or absorbed by the user's body (e.g., a finger surface) in contact with the cover glass 110. For example, at least some of the irradiated sound waves may be reflected by an air gap caused by a valley of the user's body in contact with the cover glass 110 or may be absorbed by a ridge of the user's body. The sound waves reflected by the air gap caused by the valley may travel through, for example, various media stacked or disposed under the cover glass 110 (e.g., the adhesive member 121, the polarizing plate 122, the touch panel 123, and the first electrode 124a, the display light emitting layer 124b, the second electrode 124c, the insulating layer 125 or the third electrode 126a) to reach the piezo layer 126b of the fingerprint sensor layer 126. In an embodiment of the disclosure, at least some of the plurality of piezoelectric elements included in the piezo layer 126b may generate voltages with different magnitudes by the pressure caused by the received sound waves, and the plurality of piezo TFTs 127b respectively connected to the plurality of piezoelectric elements may recognize the user fingerprint information by scanning generated voltages.

Referring to FIG. 5, according to various embodiments of the disclosure, the display 120 may change a traveling direction of at least some of sound waves generated by the fingerprint sensor layer 126, in connection with improvement in a fingerprint recognition rate of the fingerprint sensor layer 126. In this regard, the sound waves generated in the fingerprint sensor layer 126 may be radiated in various directions, and at least some of the radiated sound waves may be directed to a lower portion of the fingerprint sensor layer 126. Accordingly, the display 120 may include a structure for reflecting or refracting at least some of the radiated sound wave in an area of the lower portion of the fingerprint sensor layer 126. For example, the display 120 may include an air gap (128a) (or void) formed in an area between the substrate 128 disposed below the fingerprint sensor layer 126 and a back plate 130 (or a back cover) of the electronic device 100 (FIG. 1) disposed below the substrate 128. According to the air gap 128a, at least some of the sound waves directed to the lower portion of the fingerprint sensor layer 126 may be reflected by the air gap 128a and directed toward the above of the fingerprint sensor layer 126, and travel through media (e.g., the insulating layer 125, the first electrode 124a, the display light emitting layer 124b, the second electrode 124c, the touch panel 123, the polarizing plate 122, an adhesive member 121, and the cover glass 110 or the like) stacked or disposed on the fingerprint sensor layer 126.

Figure 6:
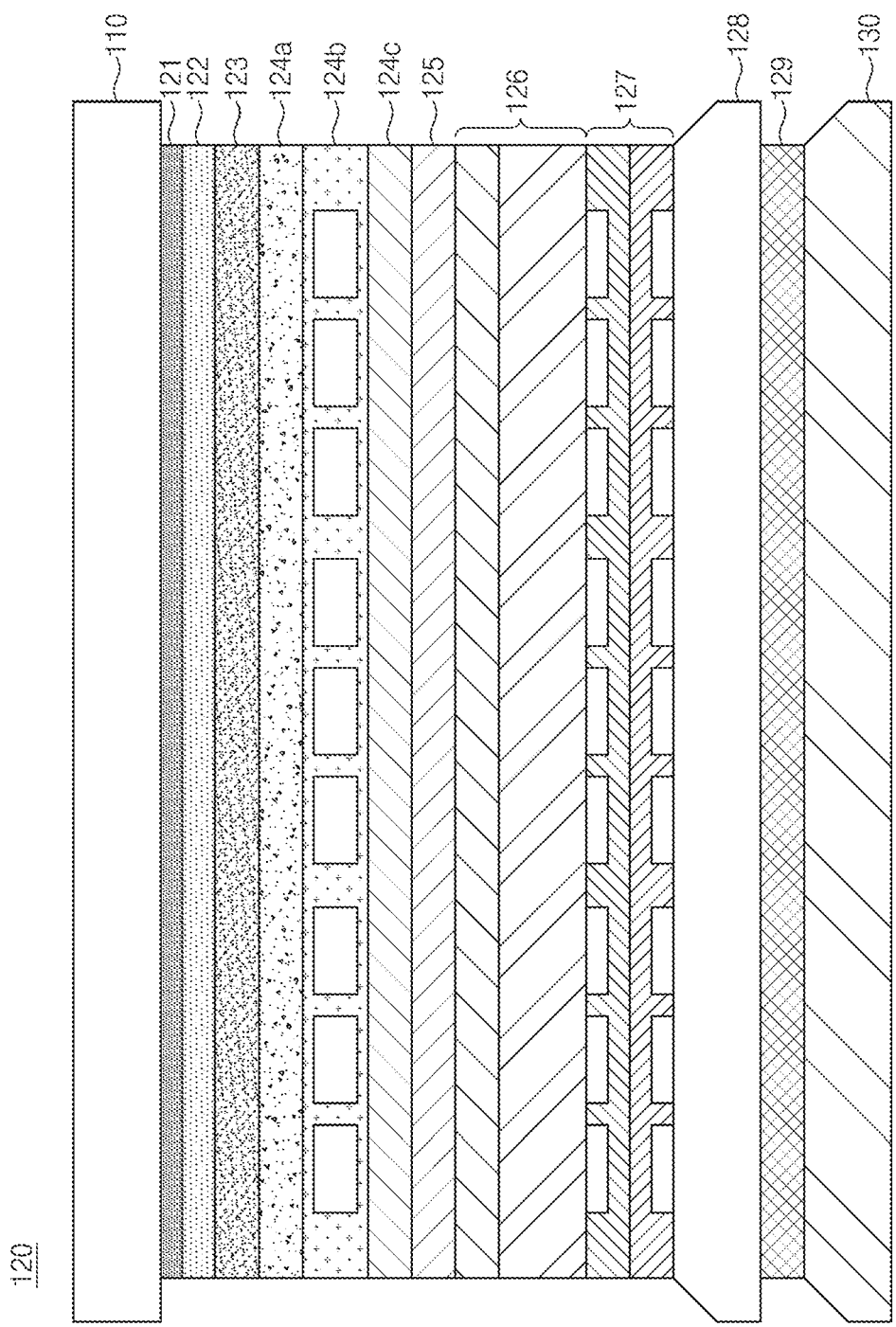
FIG. 6 is a diagram illustrating a display according to an embodiment of the disclosure.
Figure 7:
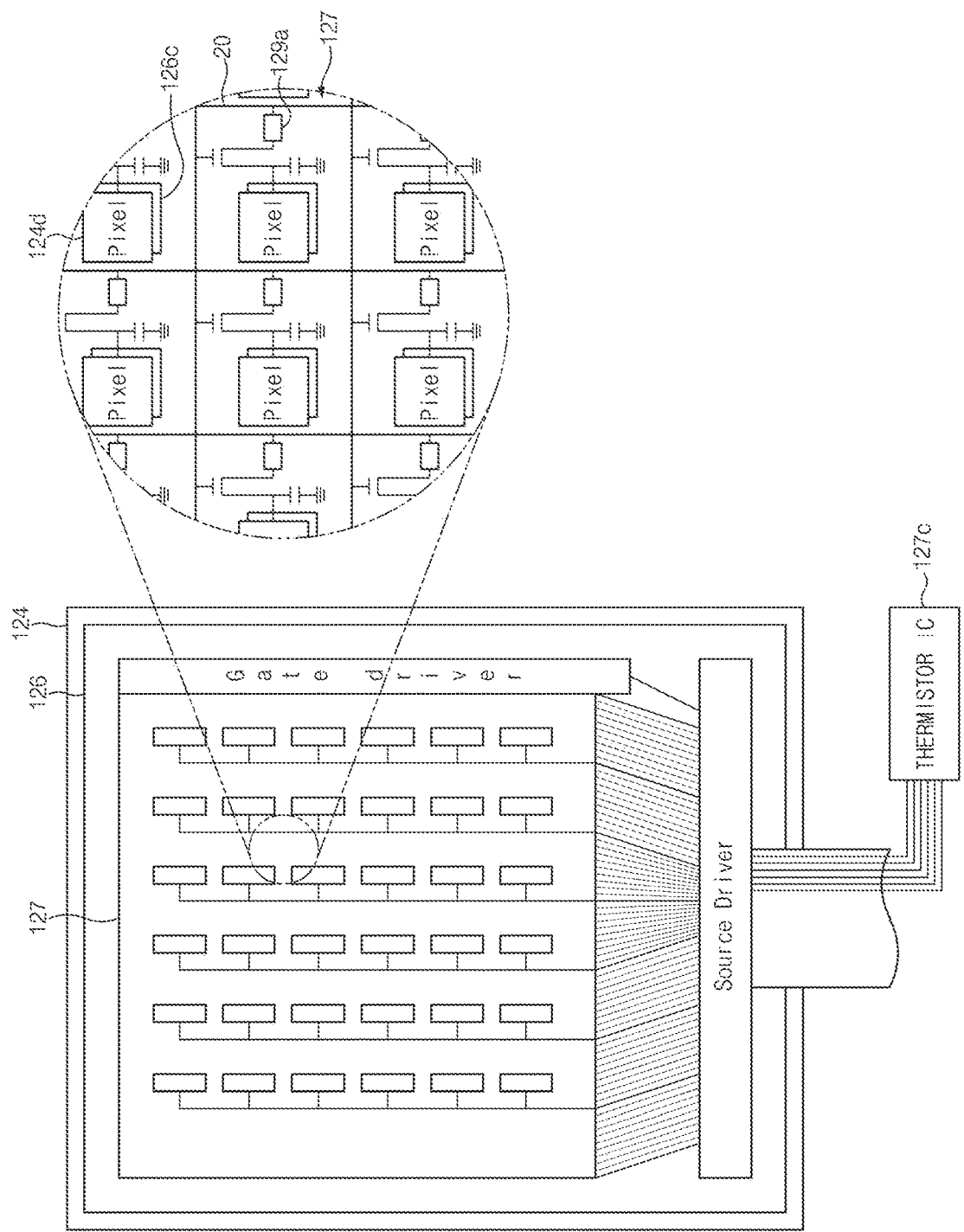
FIG. 7 is a diagram schematically illustrating an arrangement of thermistors according to an embodiment of the disclosure.

FIG. 6 is a diagram illustrating a display according to an embodiment of the disclosure, and FIG. 7 is a diagram schematically illustrating an arrangement of thermistors according to an embodiment of the disclosure.

Referring to FIGS. 6 and 7, the same reference numerals may be given to the same or corresponding components as those mentioned through FIG. 2, and overlapping descriptions may be omitted.

Referring to FIG. 6, the display 120 according to various embodiments may further include a layer related to correction of fingerprint information acquired by the fingerprint sensor layer 126. For example, the display 120 may include a thermistor layer 129 in an area between the substrate 128 corresponding to the lowermost layer of the display 120 and the back plate 130 (or a back cover) of the electronic device 100 (FIG. 1) disposed below the substrate 128.

In an embodiment of the disclosure, sound waves (e.g., ultrasonic waves) in a specific frequency band used for user fingerprint recognition may be affected by a temperature sensitively (e.g., a traveling speed), and the thermistor layer 129 may support temperature measurement for a portion with which the user's body (e.g., a finger) is in contact on the cover glass 110. According to various embodiments of the disclosure, the thermistor layer 129 may be formed to have an area corresponding to or similar to that of a light emitting structure layer including the first electrode 124a, the display light emitting layer 124b, and the second electrode 124c to cover temperature measurement for a certain portion of the active area 10 (FIG. 1) of the display 120 (or an area of the cover glass 110 corresponding to the active area 10).

In an embodiment of the disclosure, the thermistor layer 129 may include a plurality of thermistors associated with a functional operation. The plurality of thermistors may correspond to each of the plurality of pixel circuit areas included in the TFT circuit layer 127, for example. For example, the plurality of thermistors of the thermistor layer 129 may be arranged in an array corresponding one-to-one to the plurality of pixel circuit areas of the TFT circuit layer 127 disposed thereon. According to an embodiment of the disclosure, the plurality of thermistors may be triggered according to occurrence of a fingerprint authentication event (or irradiation of sound waves onto the fingerprint sensor layer 126) to perform temperature measurement in a corresponding arrangement area in real time or at a predetermined period. The temperature information measured by the plurality of thermistors may be referred to for a correction process for a fingerprint image generated based on user fingerprint information.

In connection with the correction of the fingerprint image, a processor 150 (FIG. 9) of the electronic device 100 (FIG. 9) to be described below may periodically or aperiodically generate a plurality of background images corresponding to various temperature environments. Each of the plurality of background images may be generated based on information collected by irradiation and reception of the sound waves in the fingerprint sensor layer 126 in an arbitrary temperature environment of a state in which the user body is not in contact with the cover glass 110, for example. According to one embodiment of the disclosure, the processor 150 may map the plurality of background images generated in the various temperature environments onto temperature values of corresponding temperature environments, respectively, store a result of the mapping in the form of a lookup table to be referred to for the correction of the fingerprint image. For example, the processor 150 may acquire, from the lookup table, a background image mapped onto a temperature value measured by at least some of the plurality of thermistors at a time point at which fingerprint information is acquired, and compare the acquired background image with a fingerprint image generated based on the user fingerprint information. In the comparison operation, the background image acquired from the lookup table may be referred to as a reference image for removing noise on the fingerprint image.

Referring to FIG. 7, a display (120 of FIG. 6) according to various embodiments may include the plurality of thermistors that measure a temperature at the time of occurrence of a fingerprint authentication event in some layers of layers constituting the display 120 while the configuration of the thermistor layer (129 of FIG. 6) is excluded. For example, the display 120 may include the plurality of thermistors in a light emitting structure layer 124 including the first electrode 124a (FIG. 6), the display light emitting layer 124b (FIG. 6) and the second electrode 124c (FIG. 6) and the TFT circuit layer 127 disposed below the fingerprint sensor layer 126.

In an embodiment of the disclosure, the plurality of thermistors may be arranged to be respectively allocated to the plurality of pixel circuit areas 20 included in the TFT circuit layer 127. Accordingly, in the stacked or arranged structure of the TFT circuit layer 127, the fingerprint sensor layer 126, and the light emitting structure layer 124, the plurality of thermistors 129a respectively included in the plurality of pixel circuit areas 20 of the TFT circuit layer 127, the plurality of piezoelectric elements 126c included in the fingerprint sensor layer 126, and the plurality of pixels 124d (e.g., subpixels) included in the light emitting structure layer 124 may correspond to or aligned with each other based on the plurality of pixel circuit areas 20.

According to an embodiment of the disclosure, signal wires associated with the plurality of thermistors 129a disposed in the TFT circuit layer 127 may be routed together with signal wires associated with the plurality of pixels 124d of the light emitting structure layer 124 to be drawn out to the outside of the TFT circuit layer 127. For example, the signal wires associated with the plurality of thermistors 129a may be drawn out through a source driver that applies a pixel voltage to the light emitting structure layer 124 to be connected to thermistor IC 127c disposed outside the TFT circuit layer 127.

According to various embodiments of the disclosure, the arrangement of the thermistor layer 129 (FIG. 6) or the plurality of thermistors 129a (FIG. 7) on the display 120 is not limited thereto. For example, the thermistor layer 129 or the plurality of thermistors 129a may be disposed or included as an upper layer of the light emitting structure layer 124. In this case, the thermistor layer 129 or the plurality of thermistors 129a may be formed of an optically transparent material.

Figure 8:
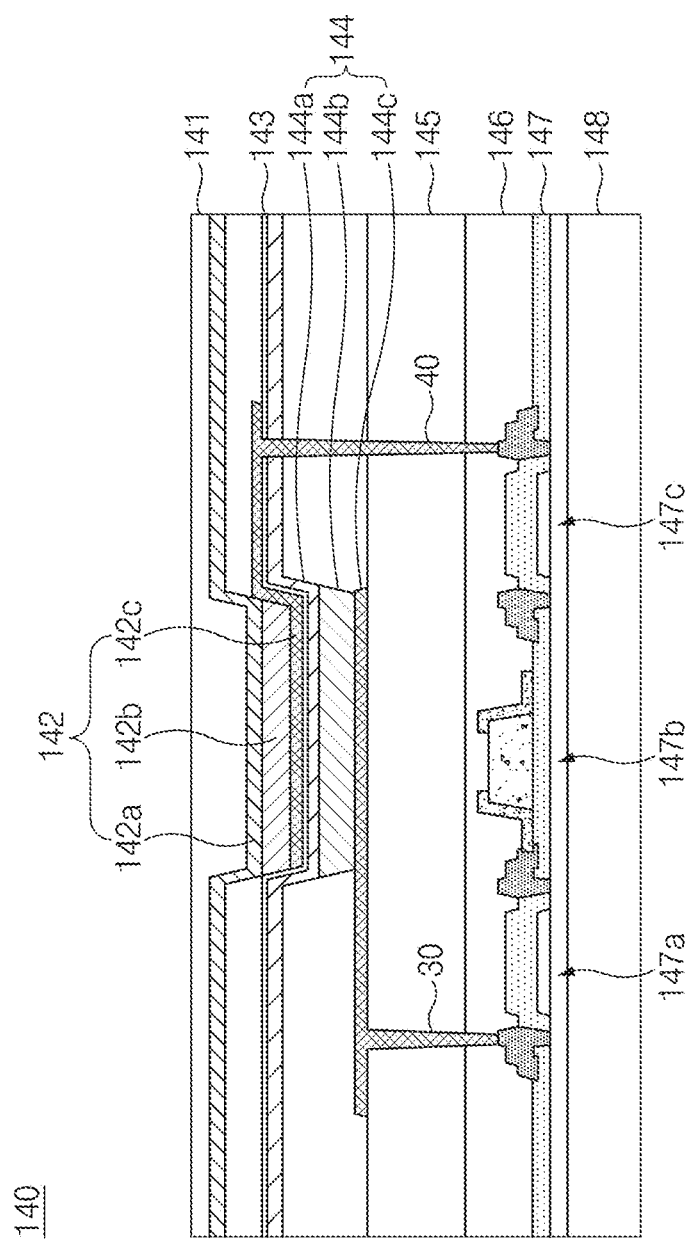
FIG. 8 is a diagram illustrating a display according to an embodiment of the disclosure.

FIG. 8 is a diagram illustrating a display according to an embodiment of the disclosure.

Referring to FIG. 8, a display 140 according to various embodiments may include a silicon-level display. In this regard, the silicon-level display 140 may include an encapsulation layer 141, a light emitting structure layer 142, a fingerprint sensor layer 144, a TFT circuit layer 147, and a substrate 148. Descriptions for the structures or functions of the light emitting structure layer 142, the fingerprint sensor layer 144, the TFT circuit layer 147, and the substrate 148, may correspond to or be similar to the descriptions for those of the light emitting structure layer including the first electrode 124a (FIG. 2), the display light emitting layer 124b (FIG. 2) and the second electrode 124c (FIG. 2), the fingerprint sensor layer 126 (FIG. 2), the TFT circuit layer 127 (FIG. 2), and the substrate 128 (FIG. 2) and therefore, overlapping description may be omitted below.

The encapsulation layer 141 may block moisture from penetrating the light emitting structure layer 142 and may protect the light emitting structure layer 142 from the outside. According to an embodiment of the disclosure, the encapsulation layer 141 may be formed by a thin film encapsulation (TFE) method of stacking a plurality of thin films of which at least some have transparent and flexible characteristics.

The light emitting structure layer 142 may include a first electrode 142a, a second electrode 142c, and a display light emitting layer 142b disposed between the first electrode 142a and the second electrode 142c. Each of the first electrode 142a and the second electrode 142c may inject holes and electrons into the display light emitting layer 142b, and a plurality of pixels (or, sub-pixels included in the plurality of pixels) which the display light emitting layer 142b includes may emit light by energy emitted by recombination of the holes and electrons.

The fingerprint sensor layer 144 may be disposed under the light emitting structure layer 142 to acquire fingerprint information of a user's body contacting the cover glass (not shown) (e.g., 110 of FIG. 2). In an embodiment of the disclosure, the fingerprint sensor layer 144 may include a third electrode 144a, a fourth electrode 144c, and a piezo layer 144b disposed between the third electrode 144a, the fourth electrode 144c. In an embodiment of the disclosure, the third electrode 144a and the fourth electrode 144c may apply a voltage to the piezo layer 144b, and at least some of a plurality of piezoelectric elements included in the piezo layer 144b may cause a physical displacement (e.g., vibration) based on the applied voltage and generate sound waves (e.g., ultrasonic waves) in a specific frequency band. Alternatively, at least some of the plurality of piezoelectric elements may generate different voltages due to pressure caused by sound waves received from the outside. In various embodiments of the disclosure, a first insulating layer 143 may be disposed between the third electrode 144a and the second electrode 142c to prevent electrical conduction therebetween.

The TFT circuit layer 147 may be disposed under the fingerprint sensor layer 144 to support individual control of each of the light emitting structure layer 142 and the fingerprint sensor layer 144 disposed thereon. In this regard, the TFT circuit layer 147 may include a plurality of piezo TFTs 147a for driving a plurality of piezoelectric elements of the fingerprint sensor layer 144 and a plurality of display TFTs 147c for driving a plurality of pixels (or a plurality of sub-pixels) of the light emitting structure layer 142 (or the display light emitting layer 142b included in the light emitting structure layer 142). According to an embodiment of the disclosure, the plurality of piezo TFTs 147a may be electrically connected to the fourth electrode 144c of the fingerprint sensor layer 144 through a first via 30. Similarly, the plurality of display TFTs 147c may be electrically connected to the second electrode 142c of the light emitting structure layer 142 through a second via 40.

In an embodiment of the disclosure, a plurality of thermistors 147b may be disposed in the TFT circuit layer 147. For example, the plurality of thermistors 147b may be alternately disposed in areas between the plurality of piezo TFTs 147a and the plurality of display TFTs 147c. The plurality of thermistors 147b may measure a temperature of a portion with which the user's body (e.g., a finger) is in contact on the display 140, and the measured temperature may be referred to for the correction of a fingerprint image according to user fingerprint information acquired by the fingerprint sensor layer 144. For example, a temperature value measured by at least some of the plurality of thermistors 147b at the time of acquiring the user fingerprint information may be used to acquire a related background image from the lookup table described above, and the acquired background image may be referred to as a reference image for removing noise on the fingerprint image generated based on the user fingerprint information.

According to various embodiments of the disclosure, a second insulating layer 146 and a protective layer 145 (e.g., an insulation layer or a passivation layer) related to insulation or protection for a plurality of TFTs (e.g., the plurality of piezo TFTs 147a and the plurality of display TFTs 147c) included in the TFT circuit layer 147 may be disposed on the TFT circuit layer 147.

The substrate 148 may physically support and fix layers stacked or disposed thereon (e.g., the TFT circuit layer 147, the second insulating layer 146, the protective layer 145, and the fingerprint sensor layer 144, the first insulating layer 143, and the light emitting structure layer 142), as a lowermost layer of the silicon-level display 140.

Figure 9:
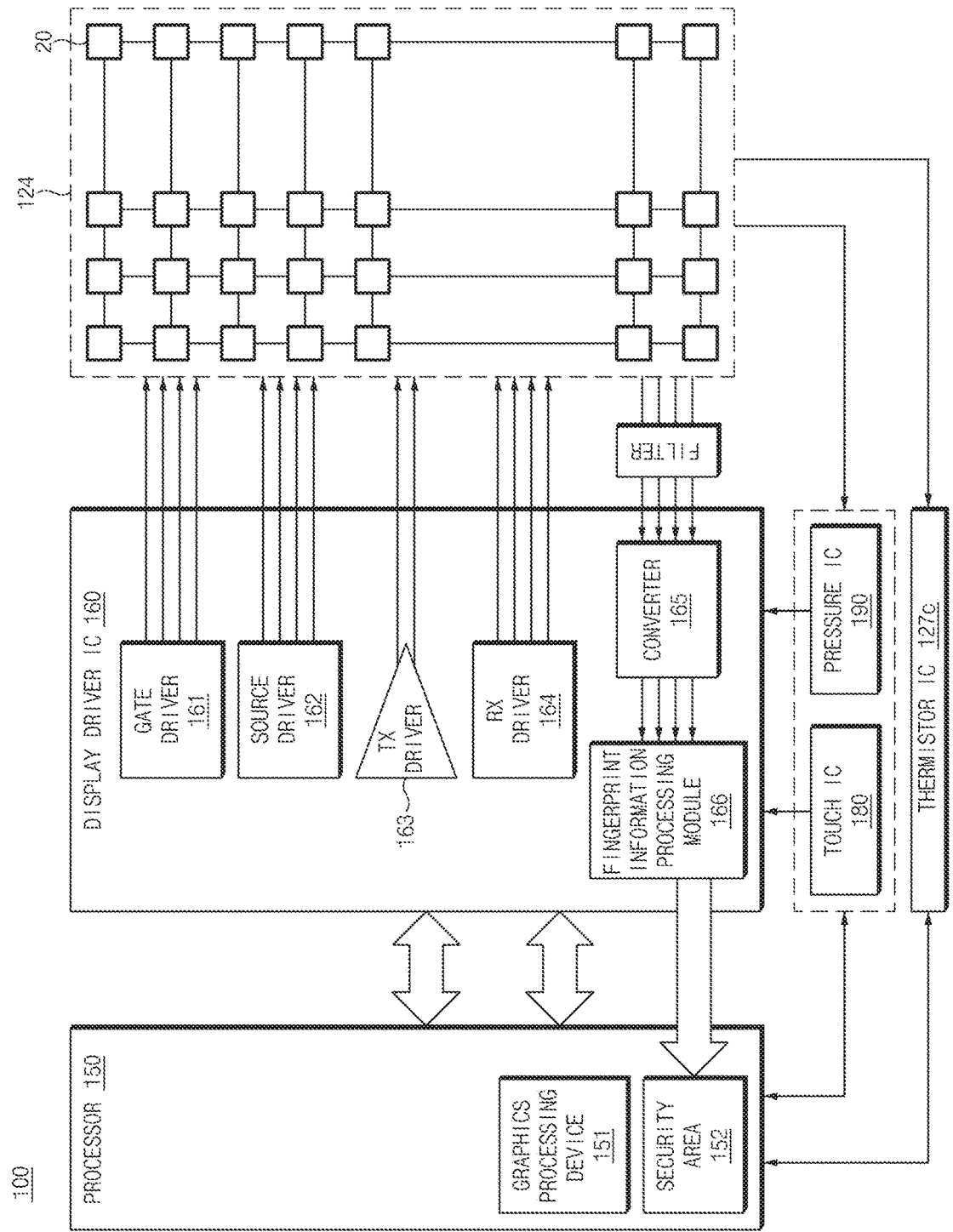
FIG. 9 is a diagram illustrating a configuration of an electronic device according to an embodiment of the disclosure.
Figure 10:
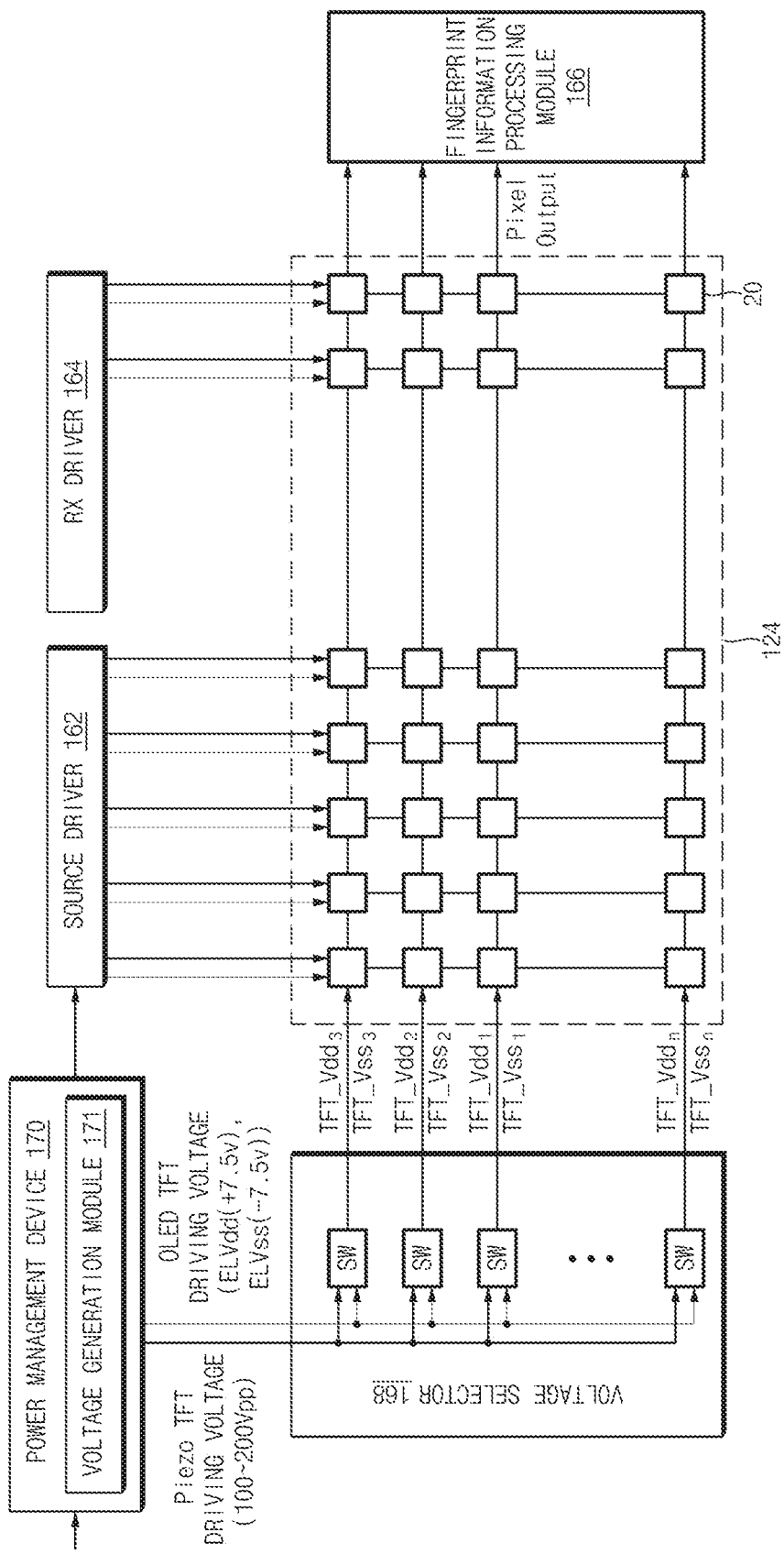
FIG. 10 is a diagram illustrating signal processing of a display driver integrated circuit (IC) according to an embodiment of the disclosure.

FIG. 9 is a diagram illustrating a configuration of an electronic device according to an embodiment of the disclosure, and FIG. 10 is a diagram illustrating signal processing of a display driver IC according to an embodiment of the disclosure.

Referring to FIGS. 9 and 10, the electronic device 100 may include the processor 150, a display driver IC 160, a power management device 170, a touch IC 180, a pressure IC 190, and the thermistor IC 127c in addition to the display of the aforementioned various embodiments (120 of FIG. 1, 2, 3, 4, 5, or 6, or 140 of FIG. 8, hereinafter collectively referred to as the display 120). In various embodiments of the disclosure, the electronic device 100 may omit at least one of the components described above, or may additionally include another component. For example, the electronic device 100 may further include a memory for storing at least one data or command related to the operation of the electronic device 100 and a communication circuit for supporting wired or wireless communication with at least one external device. Alternatively, the electronic device 100 may further include components of an electronic device 1601 to be described later with reference to FIG. 16.

The processor 150 may be implemented with a central processing unit or an application processor to control the components of the electronic device 100. For example, the processor 150 may be electrically or operatively connected to the components of the electronic device 100 to transmit a command related to the functional operation of the components, or to perform various communication operations or data processing. In an embodiment of the disclosure, the processor 150 may generate image information by using an internal graphics processing device 151 and transfer the generated image information to the display driver IC 160 such that the display 120 operates corresponding to user control or outputs various scheduled various screens. Alternatively, the processor 150 may perform user authentication based on fingerprint information received from a fingerprint sensor layer (126 of FIG. 2, 3, 4, 5, or 6, or 144 of FIG. 8, or 126, hereinafter collectively referred to as the fingerprint sensor layer 126) included in the display 120. For example, the processor 150 may perform a series of processes for authenticating a user by extracting unique minutiae features from a user fingerprint image generated based on the fingerprint information received from the fingerprint sensor layer 126, and performing comparative analysis with a template pre-registered in the security area 152.

The display driver IC 160 may be electrically connected to the light emitting structure layer 124 to transmit an image driving signal corresponding to the image information received from the processor 150 to the light emitting structure layer 124. In this regard, the display driver IC 160 may include a gate driver 161 and a source driver 162 that apply a driving voltage to at least some of the plurality of pixels included in the light emitting structure layer 124. Alternatively, the display driver IC 160 may include a transmit (TX) driver 163, a receive (RX) driver 164, a converter 165, a fingerprint information processing module 166, and a voltage selector 168 related to driving of the fingerprint sensor layer 126 of the display 120.

In the case of the TX operation of the fingerprint sensor layer 126, the TX driver 163 may apply an analog signal to an electrode (126a of FIG. 2, 3 or 4) adjacent to the piezo layer 126b to apply a voltage to the piezo layer 126b such that the piezo layer 126b (FIG. 2, 3, or 4) of the fingerprint sensor layer 126 causes a physical displacement (e.g., vibration) according to the applied voltage to generate sound waves (e.g., ultrasonic waves) in a specified frequency band. The RX driver 164 may apply a voltage to at least some of at least some of a plurality of piezo TFTs (127b of FIG. 2, 3 or 4, or 147a of FIG. 8, hereinafter collectively referred to as a plurality of piezo TFTs 127b) included in a TFT circuit layer (127 of FIG. 2, 3 or 4, or 127 of FIG. 6, or 147 of FIG. 8, hereinafter collectively referred to as a TFT circuit layer 127) in the case of the RX operation of the fingerprint sensor layer 126. For example, the RX driver 164 may apply a voltage such that at least some of the piezo TFTs 127b is switched to a corresponding piezoelectric element among the plurality of piezoelectric elements included in the piezo layer 126b to be electrically connected thereto in connection with scanning of a voltage generated in the piezo layer 126b according to sound waves reflected on the user's body. The converter 165 (e.g., an analog digital converter (ADC)) may receive an analog signal corresponding to a scanned voltage from the at least some piezo TFTs 127b, which have scanned the voltage, through a pixel output wiring line, and convert the analog signal to digital data. According to various embodiments of the disclosure, the analog signal may be provided to the converter 165 after the analog signal is preprocessed (e.g., noise-removed) by a specified filter. The fingerprint information processing module 166 may generate a fingerprint image of the user based on the digital data received from the converter 165, compress the fingerprint image, and transmit the compressed fingerprint image to the processor 150. In various embodiments of the disclosure, the fingerprint information processing module 166 may include another processor that operates independently of the processor 150 in connection with user fingerprint authentication. For example, the fingerprint information processing module 166 may include a processor capable of processing fingerprint information acquired by the fingerprint sensor layer 126 while excluding the wake up of the processor 150 when the processor 150 is in a sleep state. In this case, the fingerprint information processing module 166 may generate a fingerprint image of the user based on the digital data received from the converter 165, access the security area 152 of the processor 150, and perform a comparative analysis between the fingerprint image with a templet to authenticate the user by themselves. According to various embodiments of the disclosure, at least some components (e.g., the TX driver 163, the RX driver 164, and the converter 165, the fingerprint information processing module 166 and/or the voltage selector 168) included in the display driver IC 160 in connection with the functional operation of the fingerprint sensor layer 126 may be implemented as separate modules independent of the display driver IC 160.

The power management device 170 may supply driving power to the components of the electronic device 100. In this regard, the power management device 170 may generate a first voltage with a first voltage level (e.g., voltage drain (Vdd) (about +7.5V)/voltage source supply (Vss) (about −7.5V)) for driving of a plurality of display TFTs (127a in FIG. 2 or FIG. 3 or 147c of FIG. 8, hereinafter collectively referred to as the plurality of display TFTs 127a) of the TFT circuit layer 127 and a second voltage with a voltage level (e.g., Vdd (about +100V)/Vss (about −100V)) for driving of the plurality of piezo TFTs 127b, by using an internal voltage generation module 171. In an embodiment of the disclosure, the power management device 170 may supply the first voltage and the second voltage generated to the voltage selector 168 included in the display driver IC 160, and the voltage selector 168 may selectively supply the first voltage related to the operation of the light emitting structure layer 124 or the second voltage related to the operation of the fingerprint sensor layer 126 to the source driver 162 or the RX driver 164 under the control of the processor 150 (or the fingerprint information processing module 166).

In an embodiment of the disclosure, the processor 150 may select some piezo TFTs 127b related to voltage scanning for the piezo layer 126b of the plurality of piezo TFTs 127b based on location information of a user's body in contact with the electronic device 100 (or the active area 10 (FIG. 1) of the display 120). In this regard, the processor 150 may be receive the position information of a contact area of the user's body from the touch IC 180 or the pressure IC 190 electrically connected to a touch panel (123 of FIG. 1, 2, 3, 4, 5, or 6) included in the display 120 or a pressure panel (not shown) and determine at least one pixel circuit area 20 corresponding to the position information of the user's body among the plurality of pixel circuit areas 20 included in the TFT circuit layer 127. The processor 150 may transmit information on the determined at least one pixel circuit area 20 to the RX driver 164 such that a voltage related to voltage scanning is applied to some of the piezo TFTs 127b included in the determined at least one pixel circuit area 20. Accordingly, the RX driver 164 may selectively supply a voltage only to some of the piezo TFTs 127b corresponding to the contact area of the user's body among the plurality of piezo TFTs 127b included in the TFT circuit layer 127 to drive only some of the piezoelectric elements corresponding to some of the piezo TFTs 127b.

The thermistor IC 127c may be electrically connected to a thermistor layer (129 of FIG. 6) or a plurality of thermistors (129a of FIG. 7 or 147b of FIG. 8) included in the display 120 to acquire temperature information of the contact area of the user's body and transfer the temperature information to the processor 150. According to an embodiment of the disclosure, before the processor 150 compares and analyzes the fingerprint image generated according to the user fingerprint information with a template in the security area 152, the processor 150 may correct the fingerprint image based on the temperature information received from the thermistor IC 127c. In this regard, the processor 150 may generate a plurality of background images respectively corresponding to the various temperature environments based on information collected due to irradiation and reception of sound waves in the fingerprint sensor layer 126 in various temperature environments in which the user's body does not come into contact with the active area 10 (or an area of the cover glass 110 corresponding to the active area 10) of the display 120. The processor 150 may construct a lookup table by respectively mapping a plurality of background images onto temperature values of corresponding temperature environments, and refer to the constructed lookup table for correction of the fingerprint image. For example, the processor 150 may acquire a background image mapped onto temperature information (e.g., a temperature value) received from the thermistor IC 127c from the lookup table, and compare the acquired background image with the fingerprint image and remove a noise from the fingerprint image.

Figure 11:
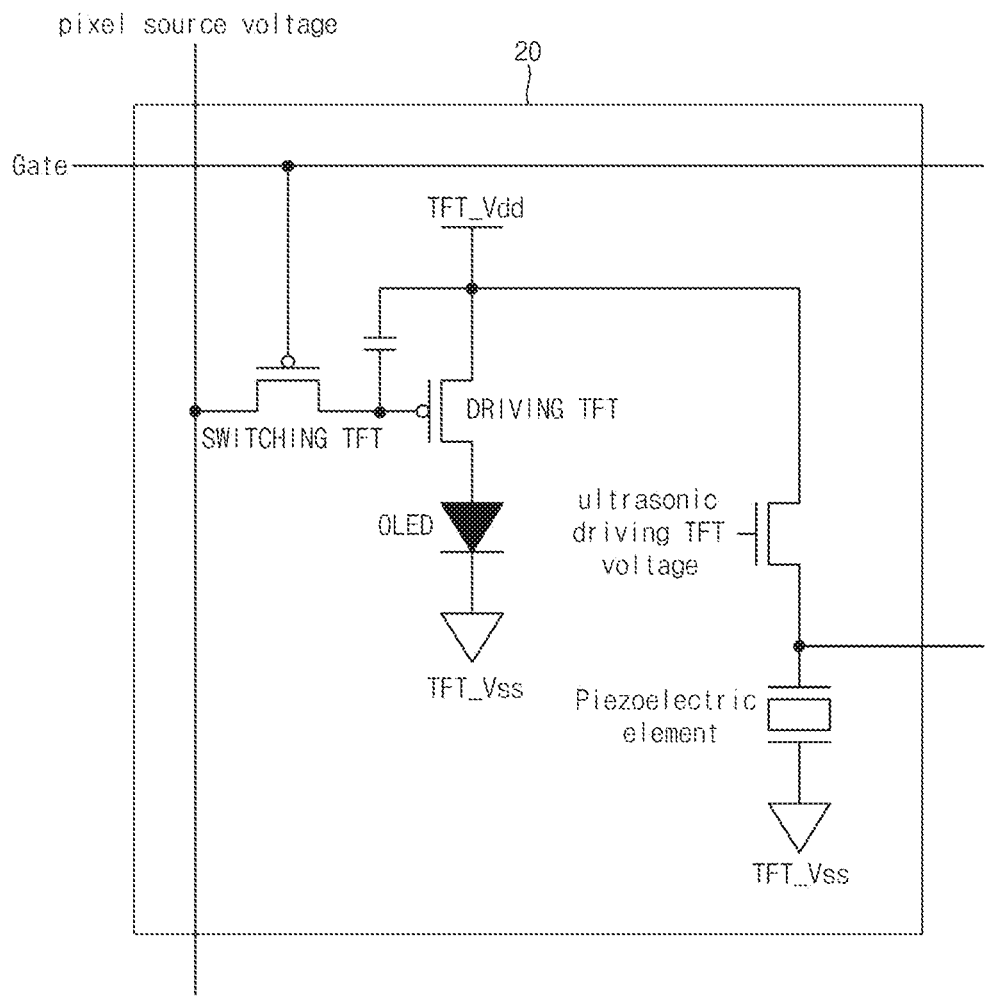
FIG. 11 is a diagram illustrating a first pixel circuit area of a display according to an embodiment of the disclosure.
Figure 12:
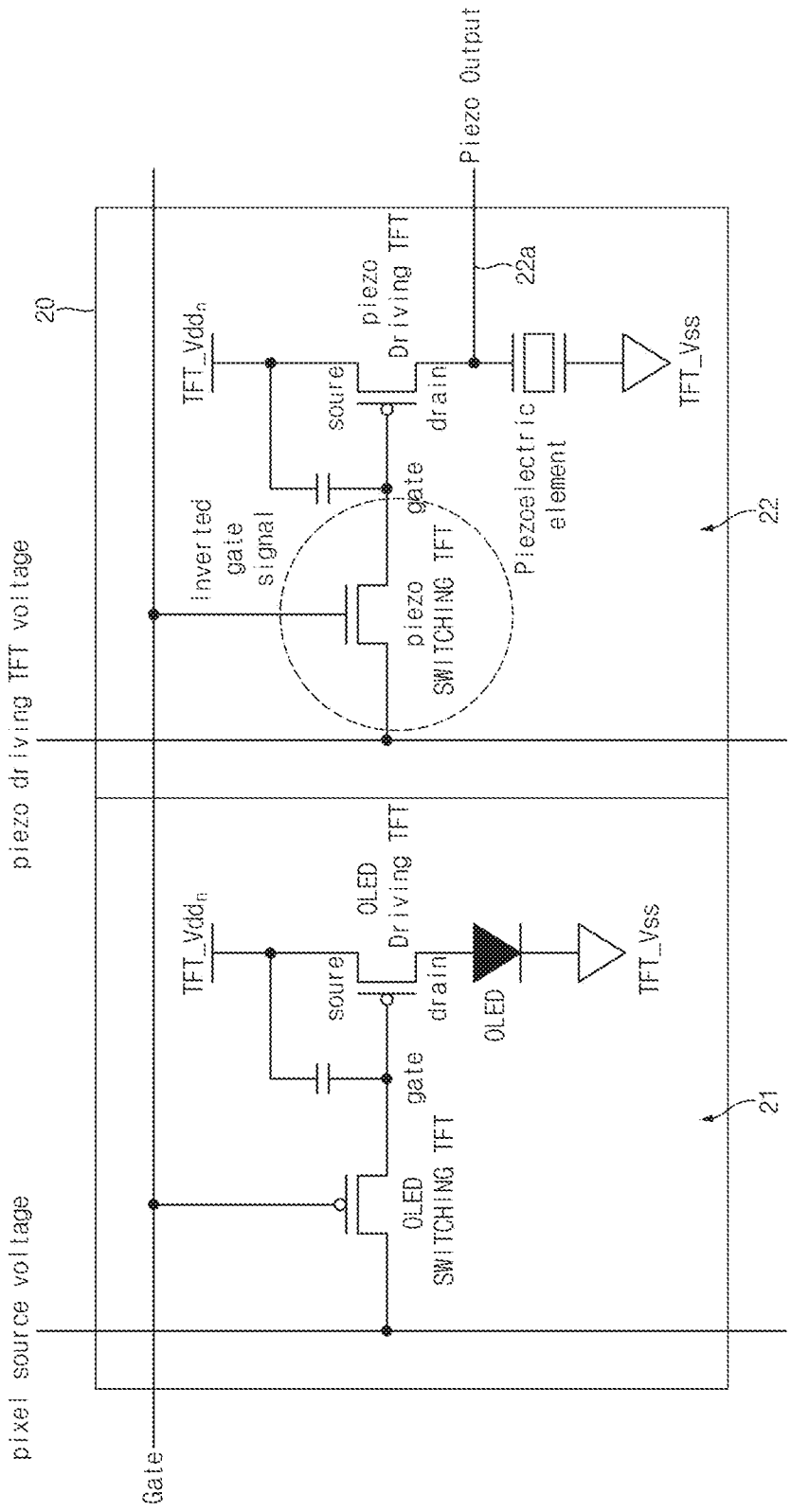
FIG. 12 is a diagram illustrating a second pixel circuit area of a display according to an embodiment of the disclosure.

FIG. 11 is a diagram illustrating a first pixel circuit area of a display according to an embodiment of the disclosure, and FIG. 12 is a diagram illustrating a second pixel circuit area of a display according to an embodiment of the disclosure.

Referring to FIGS. 11 and 12, when a gate voltage is supplied to the pixel circuit areas 20 by a gate driver (161 of FIG. 9), a pixel source voltage by a source driver (162 of FIG. 9) may be supplied as a threshold voltage of a display driving TFT (e.g., 127a of FIG. 2 or 3, or 147c of FIG. 8, hereinafter collectively referred to as the display driving TFT 127a) to enable the amount of current flowing from the TFT_Vdd to the TFT_Vss to be adjusted. Accordingly, a brightness of a display (120, FIG. 1, 2, 3, 4, 5 or 6, or 140 of FIG. 8, hereinafter, collectively referred to as the display 120) may vary according to a current flowing in proportion to the pixel source voltage, and an emission color may be determined according to the combination of the sub-pixels RGB included in the display 120. According to various embodiments of the disclosure, when an electronic device (100 of FIG. 1 or 9) performs the fingerprint sensing function, a gate voltage by the gate driver 161 may not be supplied to the pixel circuit areas 20. In this case, the display driving TFT 127a may be opened so that no current flows in the display 120, and a plurality of piezo TFTs (127b in FIG. 2, 3 or 4, or 147a in FIG. 8, hereinafter, collectively referred to as the plurality of piezo TFTs 127b) may be driven by an ultrasonic driving voltage to apply a voltage to a piezoelectric element.

In various embodiments of the disclosure, when sound waves (e.g., ultrasonic waves) in a specified frequency band, which are reflected on and returned from the user's body, reach the piezoelectric element, a voltage according to the sound waves may be scanned by the plurality of piezo TFTs 127b and an analog signal according to the scanning may be transmitted to a fingerprint information processing module (166 of FIG. 9) through a pixel output wiring line 22a. The fingerprint information processing module 166 may generate a fingerprint image of a user by combining analog signals transmitted from a plurality of pixel circuit areas.

Figure 13:
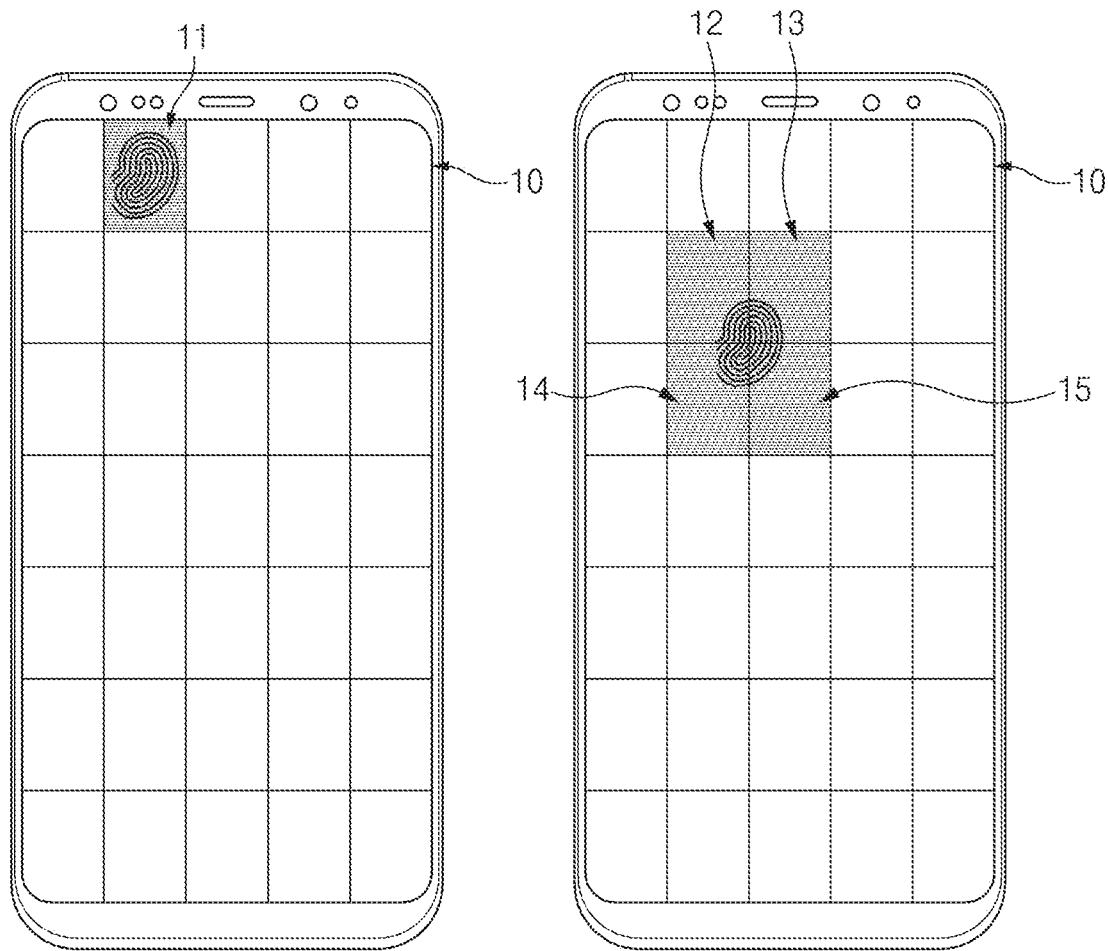
FIG. 13 is a diagram illustrating a relationship between a fingerprint input position and a thermistor according to an embodiment of the disclosure.

FIG. 13 is a diagram illustrating a relationship between a user fingerprint input position and a thermistor according to an embodiment of the disclosure.

Referring to FIG. 13, when a user fingerprint authentication event occurs, the processor 150 (FIG. 9) of the electronic device 100 may divide the active area 10 of a display (120 of FIG. 1, 2, 3, 4, 5, or 6 or 140 of FIG. 8, hereinafter collectively referred to as the display 120) into a plurality of virtual areas. For example, the processor 150 may divide the active area 10 into a plurality of virtual areas one-to-one corresponding to the plurality of pixel circuit areas based on a plurality of pixel circuit areas (20 of FIG. 7) included in a TFT circuit layer (127 in FIG. 2, 3 or 4, 127 in FIG. 6, or 147 in FIG. 8, hereinafter collectively referred to as the TFT circuit layer 127) disposed under the active area 10.

Referring to the foregoing description, a thermistor may be disposed in each of the plurality of pixel circuit areas 20. Alternatively, the plurality of thermistors included in the thermistor layer 129 (FIG. 6) stacked with the TFT circuit layer 127 may be disposed to correspond one-to-one with the plurality of pixel circuit areas 20 of the TFT circuit layer 127. Accordingly, each of the plurality of virtual areas divided to correspond to or be aligned with the plurality of pixel circuit areas 20 on the active area 10 may correspond one-to-one with the plurality of thermistors under the active area 10.

According to an embodiment of the disclosure, a user's body (e.g., a finger) contacting the active area 10 (or the area of the cover glass 110 (FIG. 2) corresponding to the active area 10) in connection with user fingerprint authentication may be included in at least one area of the plurality of virtual areas which are resulted from division. For example, the user body may be included in a single first virtual area 11 of the plurality of virtual areas. In this case, the processor 150 may correct a user fingerprint image by referring to temperature information received from the thermistor corresponding to the single first virtual area 11. Alternatively, the user body may be placed on a plurality of virtual areas (e.g., a second virtual area 12, a third virtual area 13, a fourth virtual area 14, and a fifth virtual area 15) adjacent to each other among the plurality of virtual areas. In this case, the processor 150 may correct the user fingerprint image by referring to all pieces of temperature information received from a plurality of thermistors respectively corresponding to the plurality of virtual areas 12, 13, 14, and 15. For example, the processor 150 may refer to temperature information of a thermistor corresponding to the second virtual area 12 with respect to the fingerprint image area representing the fingerprint of the user body in contact with the second virtual area 12 and refer to temperature information of a thermistor corresponding to the third virtual area 13 with respect to the fingerprint image area representing the fingerprint of the user body in contact with the third virtual area 13, among the generated fingerprint images. As described above, the processor 150 may correct fingerprint image areas respectively corresponding to the plurality of virtual areas 12, 13, 14, and 15 by referring to pieces of temperature information of the thermistors corresponding to the corresponding virtual areas, and generate one fingerprint image by combining the plurality of corrected fingerprint image areas.

Figure 14:
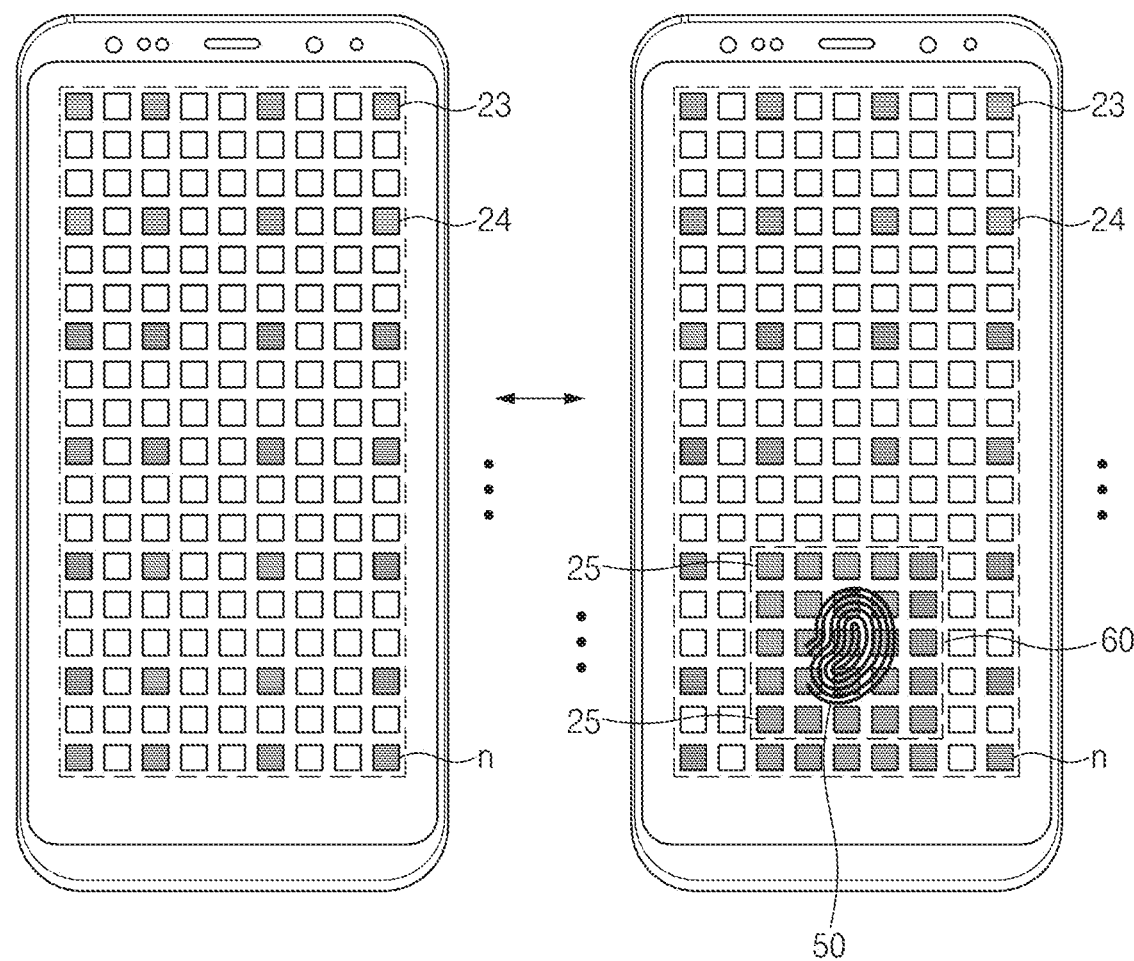
FIG. 14 is a diagram illustrating a process of operating a fingerprint sensor of an electronic device according to an embodiment of the disclosure.

FIG. 14 is a diagram illustrating a process of operating a fingerprint sensor of an electronic device according to an embodiment of the disclosure.

Referring to FIG. 14, a fingerprint sensor layer (126 of FIG. 2, 3, 4, 5 or 6, or 144 of FIG. 8, hereinafter correctively referred to as the fingerprint sensor layer 126) according to various embodiments may provide (be used with) a functional operation of a touch panel (123 in FIG. 2, 3, 4, 5, or 6) included in the display (120 of FIG. 1, 2, 3, 4, 5 or 6, or 140 of FIG. 8, hereinafter collectively referred to as the display 120) of the electronic device 100. In other words, the display 120 may not include the touch panel 123. In this case, a user input (e.g., a touch) may be detected by the fingerprint sensor layer 126 that irradiates and receives sound waves (e.g., ultrasonic waves) in a specified frequency band. In this regard, when the fingerprint sensor layer 126 performs a function of detecting the user input, the processor 150 (FIG. 9) may control driving of only some of a plurality of piezoelectric elements included in the fingerprint sensor layer 126. For example, the processor 150 may specify some pixel circuit areas 23 and 24 to "n" which are mutually spaced at specified intervals, among a plurality of pixel circuit areas (20 in FIG. 7) included in the TFT circuit layer (127 in FIG. 2, 3 or 4, 127 in FIG. 6, or 147 in FIG. 8, hereinafter collectively referred to as the TFT circuit layer 127) and control the driving of only some piezoelectric elements corresponding to the specified some pixel circuit areas 23 and 24 to "n".

According to an embodiment of the disclosure, in operation in which the fingerprint sensor layer 126 performs a function of detecting a user input, an event related to user fingerprint authentication may occur. In this case, the processor 150 may allow the display 120 to display content 50 (e.g., a fingerprint image) providing a guide for a contact area of the user's body on a portion of the active area (10 of FIG. 1). In this regard, the processor 150 may allow all piezoelectric elements corresponding to the pixel circuit area 25 within an area range 60 specified based on the content 50 for reliable collection of user fingerprint information. In this case, the processor 150 may maintain the driving of the piezoelectric elements corresponding to an area outside the specified area range 60 among some of the piezoelectric elements corresponding to the specified some pixel circuit areas 23 and 24 to "n" to cover acquisition of fingerprint information of the user's body that is in contact with an area outside the specified area range 60.

Alternatively, according to various embodiments of the disclosure, when an event related to the user fingerprint authentication occurs, the processor 150 may control deactivation of some piezoelectric elements corresponding to some of the pixel circuit areas 23 and 24 to "n" being driven. Subsequently, in the operation of displaying the content 50, the processor 150 may further control driving of all piezoelectric elements corresponding to the pixel circuit area 25 in the specified area range 60 and simultaneously or in a specified time range, further control the driving of some piezoelectric elements corresponding to some pixel circuit areas 23 and 24 to "n" other than the specified area 60.

According to various embodiments of the disclosure, the display 120 may include both the fingerprint sensor layer 126 and the touch panel 123. In this regard, the touch panel 123 may perform a function of detecting a user input related to fingerprint authentication, and the fingerprint sensor layer 126 (or a plurality of piezoelectric elements included in the fingerprint sensor layer 126) may be controlled to be in an inactive or active state according to whether the user input occurs. For example, at a time before occurrence of an event related to fingerprint authentication, the processor 150 may control the fingerprint sensor layer 126 to be in an inactive state. Alternatively, the processor 150 may control the fingerprint sensor layer 126 to be in an inactive state until a contact (or user input) of the user's body with respect to the content 50 (e.g., a fingerprint image) displayed according to occurrence of an event related to the fingerprint authentication is not detected. In an embodiment of the disclosure, when the contact (or user input) of the user's body with respect to the content 50 is detected based on the touch panel 123, the processor 150 may control at least a portion of the fingerprint sensor layer 126 to be in the active state. For example, the processor 150 may perform control to drive some piezoelectric elements of the fingerprint sensor layer 126 corresponding to the pixel circuit area 25 within the area range 60 specified based on the content 50 among the plurality of pixel circuit areas 20 included in the TFT circuit layer 127. Alternatively, when the contact of the user's body with the content 50 is detected, the processor 150 may perform control to drive all of a plurality of piezoelectric elements of the fingerprint sensor layer 126 corresponding to all of the plurality of pixel circuit areas 20 included in the TFT circuit layer 127. In an embodiment of the disclosure, when the fingerprint authentication for the user is completed, the processor 150 may control the fingerprint sensor layer 126, of which at least a portion is activated, to be in an inactive state.

Figure 15:
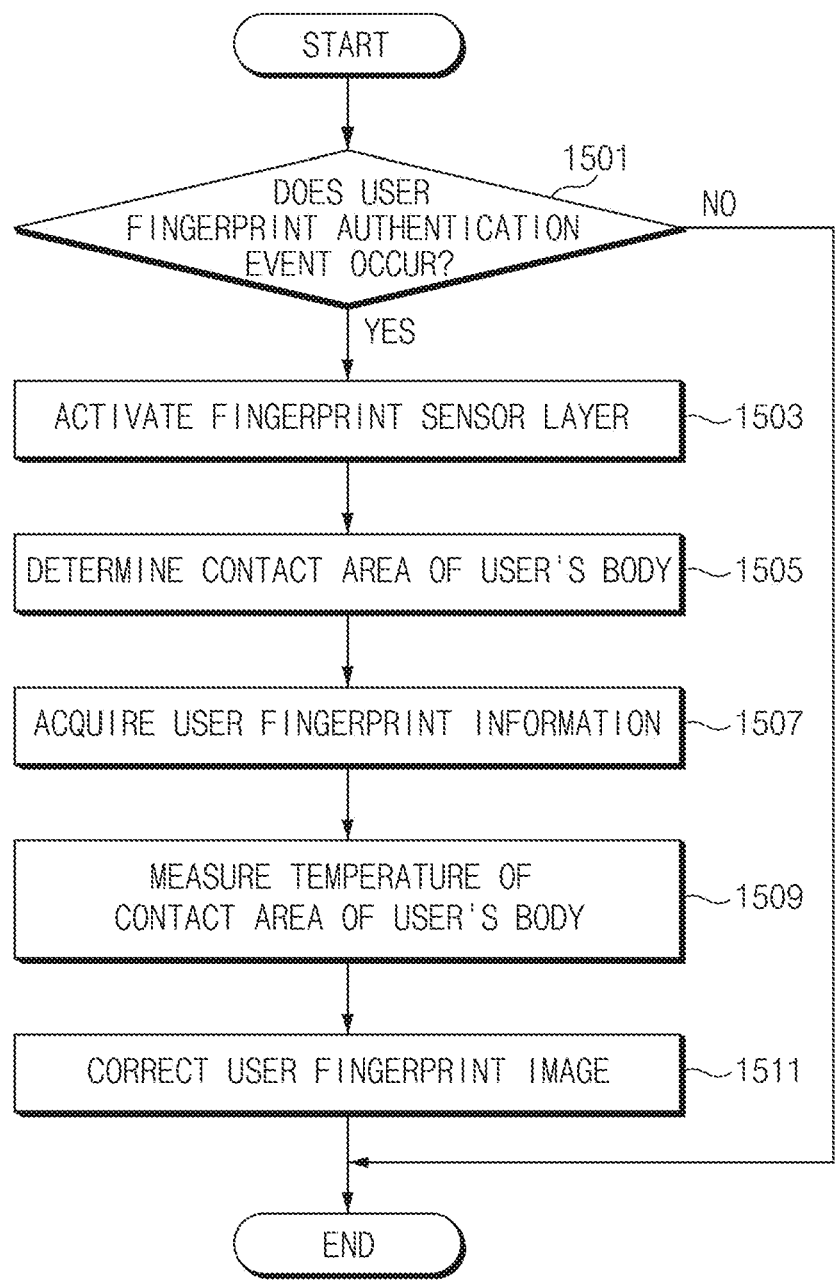
FIG. 15 is a diagram illustrating a method of operating a fingerprint sensor of an electronic device according to an embodiment of the disclosure.

FIG. 15 is a diagram illustrating a method of operating a fingerprint sensor of an electronic device according to an embodiment of the disclosure.

Referring to FIG. 15, in operation 1501, a processor (150 of FIG. 9) of an electronic device (100 of FIG. 1, 9, 13, or 14) may determine whether a specified user fingerprint authentication event occurs. For example, the processor may determine whether a specified user fingerprint authentication event requiring user fingerprint authentication occurs in the electronic device, such as screen unlock processing, electronic payment-based payment processing, mobile banking-based financial transaction processing, or unlock processing of a specified application program (e.g., message or gallery). In an embodiment of the disclosure, when it is determined that the specified user fingerprint authentication event has occurred, the processor may start a user fingerprint authentication process by driving a mounted biometric authentication system.

In operation 1503, the processor may control activation of a fingerprint sensor layer (126 of FIG. 2, 3, 4, 5, 6 or 7, or 144 of FIG. 8) included in a display of the electronic device (120 of FIG. 1, 2, 3, 4, 5 or 6, or 140 of FIG. 8) as an operation of the fingerprint authentication process. In this regard, the processor may input an analog signal in a specified frequency band to an electrode (126a of FIG. 2, 3 or 4, or 144a and 144c of FIG. 8) included in the fingerprint sensor layer by controlling a specified TX driver (163 of FIG. 9), and ground a plurality of piezo TFTs by controlling a plurality of piezo TFTs (127*b* of FIG. 2, 3, or 4, or 147*a* of FIG. 8) in a TFT circuit layer (127 of FIG. 2, 3, 4, 6 or 7 or 147 of FIG. 8) included in the display. In this case, a voltage of a predetermined magnitude may be applied to a piezo layer (126*b* of FIG. 2, 3 or 4, or 144*b* of FIG. 8) of the fingerprint sensor layer positioned between the electrode and the TFT circuit layer (or a plurality of piezo TFTs). In an embodiment of the disclosure, the plurality of piezoelectric elements included in the piezo layer may cause physical displacements (e.g., vibrations) based on the applied voltage, and at least some thereof may generate sound waves (e.g., ultrasonic waves) in a specific frequency band directed toward the above of the fingerprint sensor layer. According to various embodiments of the disclosure, in the operation of controlling the activation of the fingerprint sensor layer described above, the processor may allow the display to display content (e.g., a fingerprint image) for providing a guide for a contact area of the user's body on an active area (10 of FIG. 1 or 13) of the display.

In operation 1505, the processor may determine a contact area of the user's body in contact with an active area of the display (or an area of the cover glass (110 of FIG. 2, 3, 4, 5, or 6) corresponding to the active area). For example, the processor may receive location information on the contact area of the user's body from a touch IC (180 in FIG. 9) or a pressure IC (190 in FIG. 9) electrically connected to the touch panel (123 in FIG. 2, 3, 4, 5, or 6) or a pressure panel (not shown) included in the display. The processor may determine at least one pixel circuit area corresponding to the contact area of the user's body among a plurality of pixel circuit areas (20 in FIG. 7, 9, 10, 11, or 12) included in the TFT circuit layer, based on the location information.

In operation 1507, the processor may acquire fingerprint information of the user's body in contact with an active area (or an area of a cover glass corresponding to the active area) of the display. In this regard, the processor may ground an electrode included in the fingerprint sensor layer and supply a voltage to at least one piezo TFT corresponding to at least one pixel circuit area determined in operation 1505 among the plurality of piezo TFTs included in the TFT circuit layer by controlling a specified RX driver (164 of FIG. 9 or 10). In this case, the at least one piezo TFT may be switched to at least one corresponding piezoelectric element among the plurality of piezoelectric elements included in the piezo layer of the fingerprint sensor layer based on the supplied voltage. According to an embodiment of the disclosure, the at least one piezoelectric element may receive at least some sound waves reflected on the user's body in contact with the active area of the display among the sound waves in the specific frequency band generated in operation 1503 to generate voltages of different magnitudes and the at least one piezo TFT connected to the at least one piezoelectric element may scan the generated voltage and recognize the user fingerprint information. In an embodiment of the disclosure, the processor (or the fingerprint information processing module 166 in FIG. 9 or 10) may generate a user fingerprint image using the user fingerprint information.

In operation 1509, the processor may control a plurality of thermistors in the thermistor layer (129 of FIG. 6) or a plurality of thermistors in the TFT circuit layer, included in the display to measure the temperature of the contact area of the user's body. For example, the processor may control the plurality of thermistors such that each of the plurality of thermistors measures a temperature in a corresponding placement area at the same or similar time as the user fingerprint information acquisition performed in operation 1507.

In operation 1511, the processor may correct a user fingerprint image based on the temperature information measured by the plurality of thermistors. In this operation, the processor may receive a plurality of pieces of temperature information measured by the plurality of thermistors from a thermistor IC (127*c* in FIG. 9), and refer to at least one piece of temperature information measured by at least one thermistor corresponding to at least one pixel circuit area determined in operation 1505 among the plurality pieces of temperature information. For example, the processor may acquire at least one background image (e.g., an image generated based on information collected according to driving of the fingerprint sensor layer in a specific temperature environment where the user's body does not come into contact with an active area of a display) mapped onto the at least one piece of temperature information from a pre-built lookup table and compare the at least one background image with a user fingerprint image, thereby removing noise from the user fingerprint image.

According to various embodiments of the disclosure, when it is determined that a user fingerprint authentication event occurs in operation 1501, the processor of the electronic device may preferentially perform determination of a contact area of the user's body in operation 1505, and then control activation of the fingerprint sensor layer in operation 1503. For example, when the user's body contacts the active area of the display according to occurrence of the user fingerprint authentication event, the processor may receive location information of the contact area of the user's body from a touch IC or a pressure IC. The processor may further at least one pixel circuit area corresponding to the contact area of the user's body among a plurality of pixel circuit areas included in the TFT circuit layer, based on the location information. Thereafter, the processor may allow a TX driver to input an analog signal to an electrode included in the fingerprint sensor layer, and allow a plurality of piezo TFTs included in the TFT circuit layer to ground the electrode, to apply a voltage to a piezo layer of the fingerprint sensor layer positioned between the electrode and the TFT circuit layer. In this case, a plurality of piezoelectric elements included in the piezo layer may generate sound waves (e.g., ultrasonic waves) of a specific frequency band based on the applied voltage. According to an embodiment of the disclosure, when the determination of the contact area of the user's body in operation 1505 and the control of the activation of the fingerprint sensor layer in operation 1503 are completed, the processor may sequentially perform operations 1507, 1509, and 1511 described above. For example, the processor may scan a voltage generated by at least one piezoelectric element due to the reception of sound waves reflected on the user's body to generate a fingerprint image of the user's body, allow a plurality of thermistors to measure a temperature of the contact area of the user's body contact and correct the generated fingerprint image by referring to the measured temperature information and the pre-built lookup table.

According to the various embodiments described above, a display device may include a cover glass, a substrate disposed under the cover glass, a display light emitting layer disposed between the cover glass and the substrate and including a plurality of pixels, a fingerprint sensor layer disposed between the display light emitting layer and the substrate to generate sound waves in a specified frequency band in connection with acquiring of fingerprint information of a user's body in contact with a portion of the cover glass, and a thin film transistor (TFT) circuit layer disposed between the fingerprint sensor layer and the substrate and including a plurality of first transistors related to driving of the plurality of pixels and a plurality of second transistors related to driving of the fingerprint sensor layer.

According to the various embodiments of the disclosure, the fingerprint sensor layer may have an area corresponding to an area of the display light emitting layer or a relatively larger area than the area of the display light emitting layer.

According to the various embodiments of the disclosure, the display device may further include an insulating layer disposed between the display light emitting layer and the fingerprint sensor layer to prevent electrical conduction between the display light emitting layer and the fingerprint sensor layer (or insulate at least a portion of an area between the display light emitting layer and the fingerprint sensor layer).

According to the various embodiments of the disclosure, the fingerprint sensor layer may include a plurality of piezoelectric elements configured to cause a physical displacement according to an applied voltage to generate sound waves in the specified frequency band and receive sound waves reflected on at least a portion of the user's body to generate a voltage.

According to the various embodiments of the disclosure, the plurality of piezoelectric elements may have an array corresponding to the plurality of pixels and are included in the fingerprint sensor layer.

According to the various embodiments of the disclosure, the display may further include a thermistor layer disposed under the substrate to measure a temperature of the portion of the cover glass with which the user's body is in contact.

According to the various embodiments of the disclosure, the thermistor layer may include a plurality of thermistors arranged in an array corresponding to the plurality of pixels and in an array corresponding to the plurality of piezoelectric elements included in the fingerprint sensor layer.

According to the various embodiments of the disclosure, the TFT circuit layer may include a plurality of pixel circuit areas having an array corresponding to the plurality of pixels and an array corresponding to the plurality of piezoelectric elements included in the fingerprint sensor layer.

According to the various embodiments of the disclosure, each of the plurality of pixel circuit areas may include a transistor associated with driving of a corresponding pixel of the display light emitting layer and a transistor associated with driving of a corresponding piezoelectric element of the fingerprint sensor layer.

According to the various embodiments of the disclosure, each of the plurality of pixel circuit areas may include a thermistor configured to measure a temperature of a portion of the cover glass with which the user's body is in contact.

According to the various embodiments of the disclosure, the thermistor may be disposed in an area between a transistor related to driving of a pixel of the display light emitting layer and a transistor related to driving of a piezoelectric element of the fingerprint sensor layer.

According to the various embodiments of the disclosure, at least a portion of the display light emitting layer (or at least a portion area of the display light emitting layer) may not include an air gap or a void or may be formed in a solid type in connection with in connection with prevention of interference with the travel of sound waves which are directed toward the above of the fingerprint sensor layer (or travel in a direction of the display light emitting layer from the fingerprint sensor layer).

According to the various embodiments of the disclosure, a portion of a back surface of the substrate may include an air gap or a void in connection with a change in a traveling direction of sound waves that are directed toward the below of the fingerprint sensor layer (traveling toward a lower direction of the fingerprint sensor layer).

According to the various embodiments of the disclosure described above, an electronic device may include a cover glass, a display disposed under the cover glass to acquire fingerprint information of a user's body contacting a portion of the cover glass, a memory that stores fingerprint information of the user in advance, and a processor that performs authentication of fingerprint information acquired through the display based on the fingerprint information of the user stored in the memory in advance.

According to the various embodiments of the disclosure, the display may include a substrate, a display light emitting layer disposed between the cover glass and the substrate and including a plurality of pixels, a fingerprint sensor layer disposed between the display light emitting layer and the substrate and including a plurality of piezoelectric elements that generate sound waves in a specified frequency band in connection with acquirement of the fingerprint information, and a thin film transistor (TFT) circuit layer disposed between the fingerprint sensor layer and the substrate and including a plurality of first transistors related to driving of the plurality of pixels and a plurality of second transistors related to driving of the fingerprint sensor layer.

According to the various embodiments of the disclosure, the plurality of piezoelectric elements may have an array corresponding to the plurality of pixels included in the display light emitting layer and is included in the fingerprint sensor layer, and the TFT circuit layer may include a plurality of pixel circuit areas having an array corresponding to the plurality of pixels and an array corresponding to the plurality of piezoelectric elements included in the fingerprint sensor layer.

According to the various embodiments of the disclosure, each of the plurality of pixel circuit areas may include a transistor related to driving of a corresponding pixel of the display light emitting layer, a transistor related to driving of a corresponding piezoelectric element of the fingerprint sensor layer, and a thermistor that measures a temperature of a portion of the cover glass with which the user's body is in contact.

According to the various embodiments of the disclosure, the display device may further include a TX driver that applies a voltage to the fingerprint sensor layer in connection with generation of sound waves in the specified frequency band of the fingerprint sensor layer and an RX driver that applies a voltage to at least some of the plurality of second transistors of the TFT circuit layer in connection with reception of at least some sound waves reflected on the user's body among the sound waves in the specified frequency band of the fingerprint sensor layer.

According to the various embodiments of the disclosure, the processor may determine at least some of the plurality of pixel circuit areas corresponding to a contact area of the user's body, and transmit information on the at least some pixel circuit areas to the RX driver to supply a voltage to a transistor related to driving of the piezoelectric element included in the determined at least some pixel circuit areas.

According to the various embodiments of the disclosure, the processor may determine at least some of the plurality of pixel circuit areas corresponding to a contact area of the user's body, and correct the fingerprint information acquired by the fingerprint sensor layer by referring to temperature information of the thermistor included in the determined at least some pixel circuit areas.

Figure 16:
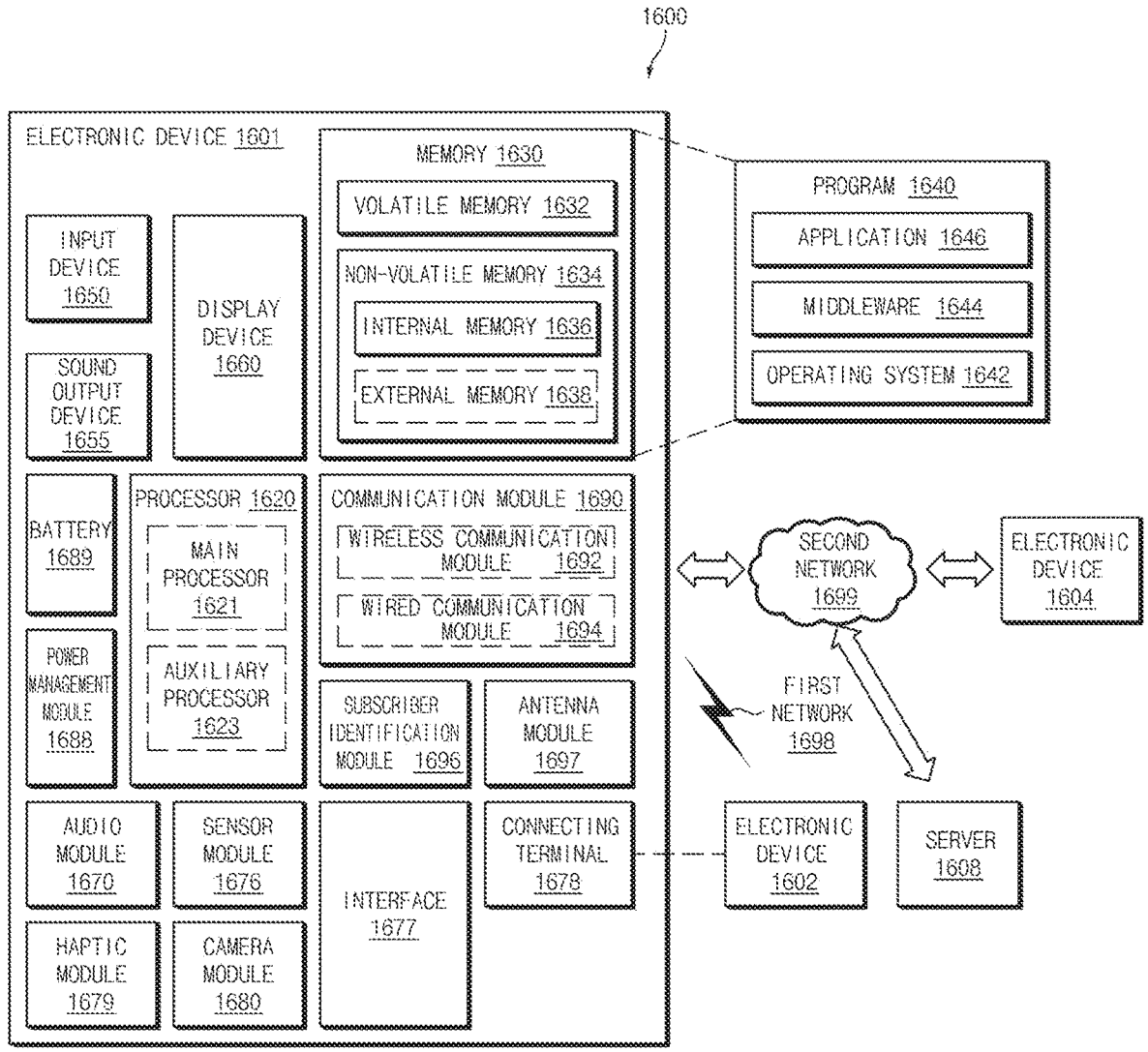
FIG. 16 is a block diagram illustrating an electronic device in a network environment according to an embodiment of the disclosure.

FIG. 16 is a block diagram illustrating an electronic device in a network environment according to an embodiment of the disclosure.

Referring to FIG. 16, an electronic device 1601 in a network environment 1600 may communicate with an electronic device 1602 via a first network 1698 (e.g., a short-range wireless communication network), or an electronic device 1604 or a server 1608 via a second network 1699 (e.g., a long-range wireless communication network). According to an embodiment of the disclosure, the electronic device 1601 may communicate with the electronic device 1604 via the server 1608. According to an embodiment of the disclosure, the electronic device 1601 may include a processor 1620, memory 1630, an input device 1650, a sound output device 1655, a display device 1660, an audio module 1670, a sensor module 1676, an interface 1677, a haptic module 1679, a camera module 1680, a power management module 1688, a battery 1689, a communication module 1690, a subscriber identification module (SIM) 1696, or an antenna module 1697. In some embodiments of the disclosure, at least one (e.g., the display device 1660 or the camera module 1680) of the components may be omitted from the electronic device 1601, or one or more other components may be added in the electronic device 1601. In some embodiments of the disclosure, some of the components may be implemented as single integrated circuitry. For example, the sensor module 1676 (e.g., a fingerprint sensor, an iris sensor, or an illuminance sensor) may be implemented as embedded in the display device 1660 (e.g., a display).

The processor 1620 may execute, for example, software (e.g., a program 1640) to control at least one other component (e.g., a hardware or software component) of the electronic device 1601 coupled with the processor 1620, and may perform various data processing or computation. According to an embodiment of the disclosure, as at least part of the data processing or computation, the processor 1620 may load a command or data received from another component (e.g., the sensor module 1676 or the communication module 1690) in volatile memory 1632, process the command or the data stored in the volatile memory 1632, and store resulting data in non-volatile memory 1634. According to an embodiment of the disclosure, the processor 1620 may include a main processor 1621 (e.g., a central processing unit (CPU) or an application processor (AP)), and an auxiliary processor 1623 (e.g., a graphics processing unit (GPU), an image signal processor (ISP), a sensor hub processor, or a communication processor (CP)) that is operable independently from, or in conjunction with, the main processor 1621. Additionally or alternatively, the auxiliary processor 1623 may be adapted to consume less power than the main processor 1621, or to be specific to a specified function. The auxiliary processor 1623 may be implemented as separate from, or as part of the main processor 1621.

The auxiliary processor 1623 may control at least some of functions or states related to at least one component (e.g., the display device 1660, the sensor module 1676, or the communication module 1690) among the components of the electronic device 1601, instead of the main processor 1621 while the main processor 1621 is in an inactive (e.g., sleep) state, or together with the main processor 1621 while the main processor 1621 is in an active state (e.g., executing an application). According to an embodiment of the disclosure, the auxiliary processor 1623 (e.g., an image signal processor or a communication processor) may be implemented as part of another component (e.g., the camera module 1680 or the communication module 1690) functionally related to the auxiliary processor 1623.

The memory 1630 may store various data used by at least one component (e.g., the processor 1620 or the sensor module 1676) of the electronic device 1601. The various data may include, for example, software (e.g., the program 1640) and input data or output data for a command related thererto. The memory 1630 may include the volatile memory 1632 or the non-volatile memory 1634.

The program 1640 may be stored in the memory 1630 as software, and may include, for example, an operating system (OS) 1642, middleware 1644, or an application 1646.

The input device 1650 may receive a command or data to be used by another component (e.g., the processor 1620) of the electronic device 1601, from the outside (e.g., a user) of the electronic device 1601. The input device 1650 may include, for example, a microphone, a mouse, a keyboard, or a digital pen (e.g., a stylus pen).

The sound output device 1655 may output sound signals to the outside of the electronic device 1601. The sound output device 1655 may include, for example, a speaker or a receiver. The speaker may be used for general purposes, such as playing multimedia or playing record, and the receiver may be used for incoming calls. According to an embodiment of the disclosure, the receiver may be implemented as separate from, or as part of the speaker.

The display device 1660 may visually provide information to the outside (e.g., a user) of the electronic device 1601. The display device 1660 may include, for example, a display, a hologram device, or a projector and control circuitry to control a corresponding one of the display, hologram device, and projector. According to an embodiment of the disclosure, the display device 1660 may include touch circuitry adapted to detect a touch, or sensor circuitry (e.g., a pressure sensor) adapted to measure the intensity of force incurred by the touch.

The audio module 1670 may convert a sound into an electrical signal and vice versa. According to an embodiment of the disclosure, the audio module 1670 may obtain the sound via the input device 1650, or output the sound via the sound output device 1655 or a headphone of an external electronic device (e.g., an electronic device 1602) directly (e.g., wiredly) or wirelessly coupled with the electronic device 1601.

The sensor module 1676 may detect an operational state (e.g., power or temperature) of the electronic device 1601 or an environmental state (e.g., a state of a user) external to the electronic device 1601, and then generate an electrical signal or data value corresponding to the detected state. According to an embodiment of the disclosure, the sensor module 1676 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1677 may support one or more specified protocols to be used for the electronic device 1601 to be coupled with the external electronic device (e.g., the electronic device 1602) directly (e.g., wiredly) or wirelessly. According to an embodiment of the disclosure, the interface 1677 may include, for example, a high definition multimedia interface (HDMI), a universal serial bus (USB) interface, a secure digital (SD) card interface, or an audio interface.

A connecting terminal 1678 may include a connector via which the electronic device 1601 may be physically connected with the external electronic device (e.g., the electronic device 1602). According to an embodiment of the disclosure, the connecting terminal 1678 may include, for example, a HDMI connector, a USB connector, a SD card connector, or an audio connector (e.g., a headphone connector).

The haptic module 1679 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 1679 may include, for example, a motor, a piezoelectric element, or an electric stimulator.

The camera module 1680 may capture a still image or moving images. According to an embodiment of the disclosure, the camera module 1680 may include one or more lenses, image sensors, image signal processors, or flashes.

The power management module 1688 may manage power supplied to the electronic device 1601. According to an embodiment of the disclosure, the power management module 1688 may be implemented as at least part of, for example, a power management integrated circuit (PMIC).

The battery 1689 may supply power to at least one component of the electronic device 1601. According to an embodiment of the disclosure, the battery 1689 may include, for example, a primary cell which is not rechargeable, a secondary cell which is rechargeable, or a fuel cell.

The communication module 1690 may support establishing a direct (e.g., wired) communication channel or a wireless communication channel between the electronic device 1601 and the external electronic device (e.g., the electronic device 1602, the electronic device 1604, or the server 1608) and performing communication via the established communication channel. The communication module 1690 may include one or more communication processors that are operable independently from the processor 1620 (e.g., the application processor (AP)) and supports a direct (e.g., wired) communication or a wireless communication. According to an embodiment of the disclosure, the communication module 1690 may include a wireless communication module 1692 (e.g., a cellular communication module, a short-range wireless communication module, or a global navigation satellite system (GNSS) communication module) or a wired communication module 1694 (e.g., a local area network (LAN) communication module or a power line communication (PLC) module). A corresponding one of these communication modules may communicate with the external electronic device via the first network 1698 (e.g., a short-range communication network, such as Bluetooth™, wireless-fidelity (Wi-Fi) direct, or infrared data association (IrDA)) or the second network 1699 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1692 may identify and authenticate the electronic device 1601 in a communication network, such as the first network 1698 or the second network 1699, using subscriber information (e.g., international mobile subscriber identity (IMSI)) stored in the subscriber identification module 1696.

The antenna module 1697 may transmit or receive a signal or power to or from the outside (e.g., the external electronic device) of the electronic device 1601. According to an embodiment of the disclosure, the antenna module 1697 may include an antenna including a radiating element composed of a conductive material or a conductive pattern formed in or on a substrate (e.g., printed circuit board (PCB)). According to an embodiment of the disclosure, the antenna module 1697 may include a plurality of antennas. In such a case, at least one antenna appropriate for a communication scheme used in the communication network, such as the first network 1698 or the second network 1699, may be selected, for example, by the communication module 1690 (e.g., the wireless communication module 1692) from the plurality of antennas. The signal or the power may then be transmitted or received between the communication module 1690 and the external electronic device via the selected at least one antenna. According to an embodiment of the disclosure, another component (e.g., a radio frequency integrated circuit (RFIC)) other than the radiating element may be additionally formed as part of the antenna module 1697.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 1601 and the external electronic device 1604 via the server 1608 coupled with the second network 1699. Each of the electronic devices 1602 and 1604 may be a device of a same type as, or a different type, from the electronic device 1601. According to an embodiment of the disclosure, all or some of operations to be executed at the electronic device 1601 may be executed at one or more of the external electronic devices 1602, 1604, or 1608. For example, if the electronic device 1601 should perform a function or a service automatically, or in response to a request from a user or another device, the electronic device 1601, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1601. The electronic device 1601 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 1640) including one or more instructions that are stored in a storage medium (e.g., internal memory 1636 or external memory 1638) that is readable by a machine (e.g., the electronic device 1601). For example, a processor (e.g., the processor 1620) of the machine (e.g., the electronic device 1601) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory storage medium" means a tangible device, and does not include a signal (e.g., an electromagnetic wave), but this term does not differentiate between where data is semi-permanently stored in the storage medium and where the data is temporarily stored in the storage medium. For example, "the non-transitory storage medium" may include a buffer where data is temporally stored.

According to an embodiment of the disclosure, a method according to various embodiments of the disclosure may be included and provided in a computer program product. The computer program product may be traded as a product between a seller and a buyer. The computer program product (e.g., downloadable app)) may be distributed in the form of a non-transitory machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

According to various embodiments of the disclosure, the fingerprint sensor having a large area may be disposed in the stacked structure of the display, thus supporting fingerprint recognition of the entire area of the active area of the display.

According to various embodiments of the disclosure, the fingerprint sensor may be disposed in the stacked structure of the display to shorten (or reduce) the distance between the user's body that is in contact with the active area of the display and the fingerprint sensor, thus improving the sensing efficiency.

According to various embodiments of the disclosure, wide accessibility of a user input contacting the active area of the display in connection with fingerprint authentication may be supported.

According to various embodiments of the disclosure, reliability of fingerprint authentication may be improved by correcting fingerprint information based on temperature information measured in the case of sensing fingerprint information.

In addition, various effects may be provided that are directly or indirectly understood through the disclosure.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A display device comprising:
   a cover glass;
   a substrate disposed under the cover glass;
   a display light emitting layer disposed between the cover glass and the substrate and including a plurality of pixels;
   a fingerprint sensor layer disposed between the display light emitting layer and the substrate to generate sound waves in a specified frequency band in connection with obtaining of fingerprint information through at least a portion of the cover glass; and
   a thin film transistor (TFT) circuit layer disposed between the fingerprint sensor layer and the substrate, the TFT circuit layer including a plurality of first transistors related to driving of the plurality of pixels and a plurality of second transistors related to driving of the fingerprint sensor layer.

2. The display device of claim 1, wherein the fingerprint sensor layer is formed with an area corresponding to the display light emitting layer or a relatively larger area than an area of the display light emitting layer.

3. The display device of claim 1, further comprising:
an insulating layer disposed between the display light emitting layer and the fingerprint sensor layer to insulate at least a portion of an area between the display light emitting layer and the fingerprint sensor layer.

4. The display device of claim 1, wherein the fingerprint sensor layer includes a plurality of piezoelectric elements configured to cause a physical displacement according to an applied voltage to generate sound waves in the specified frequency band and receive sound waves reflected on at least a portion of a user's body to generate a voltage.

5. The display device of claim 4, wherein the plurality of piezoelectric elements are formed with an array corresponding to the plurality of pixels and are included in the fingerprint sensor layer.

6. The display device of claim 4, further comprising:
a thermistor layer disposed under the substrate to measure a temperature of the portion of the cover glass with which the user's body is in contact.

7. The display device of claim 6, wherein the thermistor layer includes a plurality of thermistors arranged in an array corresponding to the plurality of pixels and in an array corresponding to the plurality of piezoelectric elements included in the fingerprint sensor layer.

8. The display device of claim 4, wherein the TFT circuit layer includes a plurality of pixel circuit areas having an array corresponding to the plurality of pixels and an array corresponding to the plurality of piezoelectric elements included in the fingerprint sensor layer.

9. The display device of claim 8, wherein each of the plurality of pixel circuit areas includes a first transistor associated with driving of a corresponding pixel of the display light emitting layer and a second transistor associated with driving of a corresponding piezoelectric element of the fingerprint sensor layer.

10. The display device of claim 9, wherein each of the plurality of pixel circuit areas includes a thermistor configured to measure a temperature of the portion of the cover glass with which a user's body is in contact.

11. The display device of claim 10, wherein the thermistor is disposed in an area between the first transistor related to driving of a pixel of the display light emitting layer and the second transistor related to driving of a piezoelectric element of the fingerprint sensor layer.

12. The display device of claim 1, wherein at least a portion of the display light emitting layer through which sound waves travel in a direction of the display light emitting layer from the fingerprint sensor layer is formed of a solid in which an air gap or a void is removed.

13. The display device of claim 1, wherein a portion of a back surface of the substrate includes an air gap or a void in connection with a change in a traveling direction of sound waves traveling toward a lower direction of the fingerprint sensor layer.

14. An electronic device comprising:
a cover glass;
a display disposed under the cover glass to acquire fingerprint information of a user's body contacting a portion of the cover glass;
a memory configured to store the fingerprint information of the user's body in advance; and
at least one processor configured to perform authentication of the fingerprint information acquired through the display based on the fingerprint information of the user's body stored in the memory in advance,
wherein the display includes:
a substrate;
a display light emitting layer disposed between the cover glass and the substrate and including a plurality of pixels;
a fingerprint sensor layer disposed between the display light emitting layer and the substrate and including a plurality of piezoelectric elements that generate sound waves in a specified frequency band in connection with acquirement of the fingerprint information; and
a thin film transistor (TFT) circuit layer disposed between the fingerprint sensor layer and the substrate and including a plurality of first transistors related to driving of the plurality of pixels and a plurality of second transistors related to driving of the fingerprint sensor layer.

15. The electronic device of claim 14,
wherein the plurality of piezoelectric elements have an array corresponding to the plurality of pixels included in the display light emitting layer and is included in the fingerprint sensor layer, and
wherein the TFT circuit layer includes a plurality of pixel circuit areas having an array corresponding to the plurality of pixels and an array corresponding to the plurality of piezoelectric elements included in the fingerprint sensor layer.

16. The electronic device of claim 15, wherein each of the plurality of pixel circuit areas includes a first transistor related to driving of a corresponding pixel of the display light emitting layer, a second transistor related to driving of a corresponding piezoelectric element of the fingerprint sensor layer, and a thermistor that measures a temperature of the portion of the cover glass with which the user's body is in contact.

17. The electronic device of claim 16, further comprising:
a transmit (TX) driver configured to apply a voltage to the fingerprint sensor layer in connection with generation of sound waves in the specified frequency band of the fingerprint sensor layer; and
a receive (RX) driver configured to apply a voltage to at least some of the plurality of second transistors of the TFT circuit layer in connection with reception of at least some sound waves reflected on the user's body among the sound waves in the specified frequency band of the fingerprint sensor layer.

18. The electronic device of claim 17, wherein the at least one processor is configured to:
determine at least some of the plurality of pixel circuit areas corresponding to a contact area of the user's body, and
transmit information on the at least some of the plurality of pixel circuit areas to the RX driver to supply a voltage to the second transistor related to driving of the piezoelectric element included in the determined at least some of the plurality of pixel circuit areas.

19. The electronic device of claim 16, wherein the at least one processor is configured to:
determine at least some of the plurality of pixel circuit areas corresponding to a contact area of the user's body, and
correct the fingerprint information acquired by the fingerprint sensor layer by referring to temperature information of the thermistor included in the determined at least some of the plurality of pixel circuit areas.

20. The electronic device of claim 19, wherein the at least one processor is configured to perform a correction by comparing image information corresponding to the temperature information stored in the memory in advance with the acquired fingerprint information.

\* \* \* \* \*